(12) United States Patent
Suzuki et al.

(10) Patent No.: US 9,396,836 B2
(45) Date of Patent: Jul. 19, 2016

(54) POLYESTER COMPOSITION AND FILM USING SAME, SHEET-LIKE STRUCTURE, ELECTRIC INSULATION SHEET, AND SOLAR CELL BACK SHEET, AND MANUFACTURING METHOD THEREFOR

(75) Inventors: Tadamasa Suzuki, Otsu (JP); Shigeru Aoyama, Otsu (JP); Hiroji Kojima, Mishima (JP); Kozo Takahashi, Otsu (JP)

(73) Assignee: Toray Industries, Inc. (JP)

( * ) Notice: Subject to any disclaimer, the term of this patent is extended or adjusted under 35 U.S.C. 154(b) by 266 days.

(21) Appl. No.: 14/003,032

(22) PCT Filed: Feb. 29, 2012

(86) PCT No.: PCT/JP2012/055061
§ 371 (c)(1),
(2), (4) Date: Sep. 4, 2013

(87) PCT Pub. No.: WO2012/121076
PCT Pub. Date: Sep. 13, 2012

(65) Prior Publication Data
US 2014/0023841 A1    Jan. 23, 2014

(30) Foreign Application Priority Data
Mar. 4, 2011 (JP) .................................. 2011-048108

(51) Int. Cl.
| | | |
|---|---|---|
| H01B 3/42 | (2006.01) | |
| C08K 3/32 | (2006.01) | |
| C08G 63/80 | (2006.01) | |
| C08G 63/83 | (2006.01) | |
| C08J 5/18 | (2006.01) | |
| H01L 31/049 | (2014.01) | |

(52) U.S. Cl.
CPC ............... H01B 3/421 (2013.01); C08G 63/80 (2013.01); C08G 63/83 (2013.01); C08J 5/18 (2013.01); C08K 3/32 (2013.01); H01L 31/049 (2014.12); C08J 2367/02 (2013.01); Y02E 10/50 (2013.01); Y10T 156/10 (2015.01); Y10T 428/2495 (2015.01)

(58) Field of Classification Search
USPC .............................. 428/213; 524/417; 156/60
See application file for complete search history.

(56) References Cited

U.S. PATENT DOCUMENTS

2011/0313102 A1*  12/2011  Kojima et al. ................. 524/706
2012/0208943 A1*   8/2012  Kojima et al. ................. 524/417

FOREIGN PATENT DOCUMENTS

| EP | 2 615 123 | 7/2013 |
|---|---|---|
| JP | 59-062626 A | 4/1984 |
| JP | 59-168024 A | 9/1984 |
| JP | 59-170118 A | 9/1984 |
| JP | 62-292431 | 12/1987 |
| JP | 62-292431 | 12/1987 |
| JP | 09-183202 A | 7/1997 |
| JP | 2000-309649 A | 11/2000 |
| JP | 2003-136658 A | 5/2003 |
| JP | 2003-306536 A | 10/2003 |
| JP | 2006-265792 A | 10/2006 |
| JP | 2008-081533 A | 4/2008 |
| JP | 2010-241974 A | 10/2010 |
| JP | 2010-248492 A | 11/2010 |
| JP | 2011006659 A1 * | 1/2011 |
| JP | 2011-119651 A | 6/2011 |
| WO | 2005/026241 A1 | 3/2005 |
| WO | WO2010103945 A1 * | 5/2010 |
| WO | 2010/103945 A1 | 9/2010 |
| WO | 2011/052290 A1 | 5/2011 |
| WO | WO 2011052290 A1 * | 5/2011 |

OTHER PUBLICATIONS

Machine English Translation JP 2011006659 A1; Nozawa, Kotaro; Polyester Film for Sealing Material for Back of Solar Battery; Jan. 13, 2011; JPO; whole document.*
Chinese Office Action dated Jun. 30, 2014 from corresponding Chinese Application No. 201280008076.8 with an English translation.
Supplementary European Search Report dated Jul. 14, 2014 from corresponding European Application No. 12 754 546.5.

* cited by examiner

Primary Examiner — Tahseen N Khan
(74) Attorney, Agent, or Firm — DLA PIPER, LLP (US)

(57) ABSTRACT

A polyester composition contains polyester, a phosphoric acid and an alkali metal phosphate, a phosphorous element content P (mol/t) is 1.8 mol/t or more and 5.0 mol/t or less relative to the whole of the polyester composition. The polyester composition contains at least one metal element of Mn and Ca, any divalent metal element content other than Mn and Ca is 5 ppm or less, and when an alkali metal element content relative to the polyester composition is denoted by M1 (mol/t), and a total amount of Mn element content and Ca element content relative to the polyester composition is denoted by M2 (mol/t), a metal element content M (mol/t) in the polyester composition which is calculated by expression (i) below and the phosphorous element content P (mol/t) satisfy expression (ii): (i) M=M1/2+M2 and (ii) $1.1 \leq M/P \leq 3.0$.

5 Claims, No Drawings

POLYESTER COMPOSITION AND FILM USING SAME, SHEET-LIKE STRUCTURE, ELECTRIC INSULATION SHEET, AND SOLAR CELL BACK SHEET, AND MANUFACTURING METHOD THEREFOR

TECHNICAL FIELD

This disclosure relates to a polyester composition having a good moist-heat resistance, a production process thereof, a film using same, a sheet-like structure comprising a layered structure using the film, and an electrical insulation sheet comprising the sheet-like structure. Furthermore, this disclosure also relates to a solar cell back sheet using the film.

BACKGROUND

Polyester resin (particularly, polyethylene terephthalate, polyethylene 2,6-naphthalene dicarboxylate, etc.) is superior in mechanical properties, thermal characteristics, chemical resistance, electrical properties and moldability, and is used for various uses. Polyester film produced by forming the above-described polyester into film, especially biaxially oriented polyester film, is used for solar cell back sheet, electrical insulation material for water heater motor, car air conditioner motor used for hybrid cars, electric insulation material for driving motors, magnetic recording material, material for capacitors, material for packing, material for construction, uses for photography, uses for graphics, and uses for thermal transfer printing.

Above all, especially for electrical insulation material (for example, used for car air-conditioner motor and driving motor) for which high heat-resistance and high moist-heat resistance are required, because films consisting only of polyester do not have sufficient heat resistance and moisture-heat resistance, JP-A-62-292431 coats both surfaces of polyester film with polyphenylene sulfide layers. Generally, polyester hydrolysis under moist-heat atmosphere proceeds by using COOH end group as a self-catalyst, and the quantity of COOH end group further increases as a result of the polyester hydrolysis. Because the hydrolysis further proceeds as the quantity of COOH end group increases, it is necessary to curb the increase of COOH end group under moist-heat atmosphere. JP-A-2010-248492 and WO 2010/103945 A curb the increase of COOH end group of polyester under moist-heat atmosphere by adding phosphoric acid and alkali metal phosphate salt to improve moist-heat resistance of a film comprising polyester compositions. Similarly, WO 2011/052290 A curbs the increase of COOH end group of polyester under moist-heat atmosphere by adding phosphoric acid and alkali metal phosphate salt to improve moist-heat resistance of a film comprising polyester compositions. JPA-2003-306536, JP-A-2008-81533, JP-A-2006-265792 and JP-A-2000-309649 improve the resistance of polyester by controlling the ratio between the amount of phosphorus compounds and the amount of metals. JP-A-2011-119651 and WO 2005/026241 A add pigments to polyester.

However, those curbs on the increase of COOH end group under moist-heat atmosphere are not sufficient, and in a long-term use, there is a concern that it is not possible to keep mechanical properties and electrical insulation property because polyester hydrolysis proceeds. In JP '492, WO '945, WO '290, JP '536, JP '533 and JP '792, the metal elements to be contained in polyester are inadequate to improve moist-heat resistance, and the moist-heat resistance of the obtained polyester composition is not sufficient. In JP '649 and JP '651, the phosphorus compounds to be contained in polyester are inadequate to improve moist-heat resistance, and the moist-heat resistance of the obtained polyester composition is not sufficient. In WO '241, neither metal elements or phosphorus compounds are added for improving moist-heat resistance of polyester, and the moist-heat resistance of the polyester composition is not sufficient.

Accordingly, it could be helpful to provide a polyester composition having an excellent moist-heat resistance by curbing the increase of COOH end group under moist-heat atmosphere, a process of producing same, a film using same, a sheet-like structure comprising a laminated structure using same film, an electrical insulation sheet having an excellent heat resistance and having an excellent moist-heat resistance by using same sheet-like structure, and processes for producing same.

SUMMARY

We thus provide a polyester composition comprising polyester as a main component, characterized in that the polyester composition contains a phosphoric acid and an alkali metal phosphate, a phosphorus element content P (mol/t) is 1.8 mol/t or more and 5.0 mol/t or less relative to the whole of the polyester composition, the polyester composition contains at least one kind of metal element of Mn or Ca, any divalent metal element content other than Mn and Ca is 5 ppm or less relative to the whole of the polyester composition, and when an alkali metal element content relative to the whole of the polyester composition is denoted by M1 (mol/t), and a total amount of Mn element content and Ca element content relative to the whole of the polyester composition is denoted by M2 (mol/t), a metal element content M (mol/t) in the polyester composition which is calculated by expression (i) below and the phosphorus element content P (mol/t) satisfy expression (ii) below:

$$M = M1/2 + M2 \quad (i)$$

$$1.1 \leq M/P \leq 3.0. \quad (ii)$$

hereinafter, this polyester composition may also be referred to simply as "polyester composition (a)."

Furthermore, in the polyester composition, it is preferred that the polyester, which is the main component of the polyester composition, contains constituent ingredients having at least three carboxylic acid groups and/or hydroxyl groups as copolymerization ingredients, and that the amount of the constituent ingredients is 0.025 mol % or more and 1.5 mol % or less relative to the whole constituent ingredients of the polyester.

Our polyester films have a layer (layer P) containing a polyester composition comprising polyester as a main component, characterized in that the polyester is biaxially oriented, the polyester composition contains a phosphoric acid and an alkali metal phosphate, a phosphorus element content P (mol/t) in the polyester composition is 1.8 mol/t or more and 5.0 mol/t or less relative to the whole of the polyester composition, the polyester composition contains at least one kind of metal element of Mn or Ca, any divalent metal element content other than Mn and Ca is 5 ppm or less relative to the whole of the polyester composition, and when an alkali metal element content relative to the whole of the polyester composition is denoted by M1 (mol/t), and a total amount of Mn element content and Ca element content relative to the whole of the polyester composition is denoted by M2 (mol/t), a metal element content M (mol/t) in the polyester composition which is calculated by expression (i) below and the phosphorus element content P (mol/t) satisfy expression (ii) below:

$$M = M1/2 + M2 \quad \text{(i)}$$

$$1.1 \leq M/P \leq 3.0. \quad \text{(ii)}$$

hereinafter, this film may be referred to simply as "film (b)."

In the film described above, the above-described P layer may be P' layer which contains polyester composition and pigment. In the P' layer described above, it is preferred that a white pigment content is 1 wt % or more and 20 wt % or less relative to the whole P' layer, or that a black pigment content is 0.5 wt % or more and 5 wt % or less relative to the whole P' layer.

Furthermore, a sheet-like structure is a sheet-like structure comprising a film as layer a (core layer), wherein the film has a layer (layer P) containing a polyester composition comprising polyester as a main component, a layer (layer b1) of either a sheet containing polyarylene sulfide as a main component or a sheet containing aramid as a main component is layered on one side of the layer a, a layer (layer b2) of either a sheet containing polyarylene sulfide as a main component or a sheet containing aramid as a main component is layered on other side of the layer a, when a thickness of the layer a is denoted by A (μm), a thickness of the layer b1 is denoted by B1 (μm) and a thickness of the layer b2 is denoted by B2 (μm), A, B1 and B2 satisfy a relational expression $0.1 \leq (B1+B2)/A \leq 4.0$, the polyester is biaxially oriented, the polyester composition contains a phosphoric acid and an alkali metal phosphate, a phosphorus element content P (mol/t) in the polyester composition is 1.8 mol/t or more and 5.0 mol/t or less relative to the whole of the polyester composition, the polyester composition contains at least one kind of metal element of Mn or Ca, any divalent metal element content other than Mn and Ca is 5 ppm or less relative to the whole of the polyester composition, and when an alkali metal element content relative to the whole of the polyester composition is represented by M1 (mol/t) and a total amount of Mn element content and Ca element content relative to the whole of the polyester composition is represented by M2 (mol/t), a metal element content M (mol/t) in the polyester composition which is calculated by expression (i) below and the phosphorus element content P (mol/t) satisfy expression (ii) below:

$$M = M1/2 + M2 \quad \text{(i)}$$

$$1.1 \leq M/P \leq 3.0. \quad \text{(ii)}$$

hereinafter, this film may be referred to simply as "sheet-like structure (c)."

In such a sheet-like structure, it is preferred that, in Raman band spectrum of 1.615 cm$^{-1}$ by laser Raman spectrometry, when an intensity in a polarization arrangement perpendicular to film plane direction is denoted by I(ND), an intensity in a polarization arrangement parallel to longitudinal direction of film is denoted by I(MD), and an intensity in a polarization arrangement parallel to transverse direction of film is denoted by I(TD), a planar orientation coefficient R of the layer a which is calculated by the following equations is 5.0 or more and 10.0 or less:

$$R = (R(MD) + R(TD))/2$$

$$R(MD) = I(MD)/I(ND)$$

$$R(TD) = I(TD)/I(ND).$$

Furthermore, our electrical insulation sheets comprise a sheet-like structure comprising a film as layer a (core layer), wherein the film has a layer (layer P) containing a polyester composition comprising polyester as a main component, a layer (layer b1) of either a sheet containing polyarylene sulfide as a main component or a sheet containing aramid as a main component is layered on one side of the layer a, a layer (layer b2) of either a sheet containing polyarylene sulfide as a main component or a sheet containing aramid as a main component is layered on other side of the layer a, when a thickness of the layer a is denoted by A (μm), a thickness of the layer b1 is denoted by B1 (μm) and a thickness of the layer b2 is denoted by B2 (μm), A, B1 and B2 satisfy a relational expression $0.1 \leq (B1+B2)/A \leq 4.0$, the polyester is biaxially oriented, the polyester composition contains a phosphoric acid and an alkali metal phosphate, a phosphorus element content P (mol/t) in the polyester composition is 1.8 mol/t or more and 5.0 mol/t or less relative to the whole of the polyester composition, the polyester composition contains at least one kind of metal element of Mn or Ca, any divalent metal element content other than Mn and Ca is 5 ppm or less relative to the whole of the polyester composition, and when an alkali metal element content relative to the whole of the polyester composition is represented by M1 (mol/t) and a total amount of Mn element content and Ca element content relative to the whole of the polyester composition is represented by M2 (mol/t), a metal element content M (mol/t) in the polyester composition which is calculated by expression (i) below and the phosphorus element content P (mol/t) satisfy expression (ii) below:

$$M = (M1)/2 + M2 \quad \text{(i)}$$

$$1.1 \leq M/P \leq 3.0. \quad \text{(ii)}$$

hereinafter, this electrical insulation sheet may be referred to simply as "electrical insulation sheet (d)."

Our solar cell back sheets comprise a polyester composition comprising polyester as a main component, characterized in that the polyester composition contains a phosphoric acid and an alkali metal phosphate, a phosphorus element content P (mol/t) in the polyester composition is 1.8 mol/t or more and 5.0 mol/t or less relative to the whole of the polyester composition, the polyester composition contains at least one kind of metal element of Mn or Ca, any divalent metal element content other than Mn and Ca is 5 ppm or less relative to the whole of the polyester composition, and when an alkali metal element content relative to the whole of the polyester composition is represented by M1 (mol/t) and a total amount of Mn element content and Ca element content relative to the whole of the polyester composition is represented by M2 (mol/t), a metal element content M (mol/t) in the polyester composition which is calculated by expression (i) below and the phosphorus element content P (mol/t) satisfy expression (ii) below:

$$M=(M1)/2+M2 \quad (i)$$

$$1.1 \leq M/P \leq 3.0. \quad (ii)$$

Our process of producing the polyester composition comprises:
an ester exchange process in which an ester exchange reaction is performed by using a dicarboxylic acid dimethyl ester and a diol in a presence of manganese acetate and/or calcium acetate as a catalyst, and
a polymerization process in which a polymerization is performed after an alkali metal phosphate of 0.5 mol/t or more and 3.0 mol/t or less is added to a composition obtained by the ester exchange process and a phosphorus acid of 0.4 times or more and 1.5 times or less in terms of the number of moles relative to the alkali metal phosphate is added.

Our process of producing the film comprises:
an ester exchange process in which an ester exchange reaction is performed by using a dicarboxylic acid dimethyl ester and a diol in a presence of manganese acetate and/or calcium acetate as a catalyst,
a polymerization process in which a polymerization is performed after an alkali metal phosphate of 0.5 mol/t or more and 3.0 mol/t or less is added to a composition obtained by the ester exchange process and a phosphorus acid of 0.4 times or more and 1.5 times or less in terms of the number of moles relative to the alkali metal phosphate is added,
a biaxial orientation process in which, when a glass transition temperature of polyester composition is denoted by Tg (° C.), a polyester composition which is obtained by the polymerization process and is formed into a sheet shape is oriented biaxially and successively at a temperature in a range from Tg° C. or higher to Tg+40° C. or lower by an area multiplier of 14 or more, and
a heat treatment process in which, when a melting point of polyester composition is denoted by Tm (° C.) and a heat treatment temperature is denoted by Th (° C.), the heat treatment process is performed subsequent to the biaxial stretching process under conditions where the following Equation (iii) is satisfied:

$$45 \leq Tm-Th \leq 90. \quad (iii)$$

Our process of producing the sheet-like structure comprises:
an ester exchange process in which an ester exchange reaction is performed by using a dicarboxylic acid dimethyl ester and a diol in a presence of manganese acetate and/or calcium acetate as a catalyst,
a polymerization process in which a polymerization is performed after an alkali metal phosphate of 0.5 mol/t or more and 3.0 mol/t or less is added to a composition obtained by the ester exchange process and a phosphorus acid of 0.4 times or more and 1.5 times or less in terms of the number of moles relative to the alkali metal phosphate is added,
a biaxial orientation process in which, when a glass transition temperature of polyester composition is denoted by Tg (° C.), a polyester composition which is obtained by the polymerization process and is formed into a sheet shape is oriented biaxially and successively at a temperature in a range from Tg° C. or higher to Tg+40° C. or lower by an area multiplier of 14 or more,
a heat treatment process in which, when a melting point of polyester composition is denoted by Tm (° C.) and a heat treatment temperature is denoted by Th (° C.), the heat treatment process is performed subsequent to the biaxial stretching process under conditions where the following Equation (iii) is satisfied, and
a layering process in which the film is set to be layer a (core layer), a layer (layer b1) of either a sheet containing polyarylene sulfide as a main component or a sheet containing aramid as a main component is layered on one side of layer a, and a layer (layer b2) of either a sheet containing polyarylene sulfide as a main component or a sheet containing aramid as a main component is layered on other side of the layer a:

$$45 \leq Tm-Th \leq 90. \quad (iii)$$

Our process of producing the electrical insulation sheet comprises:
an ester exchange process in which an ester exchange reaction is performed by using a dicarboxylic acid dimethyl ester and a diol in a presence of manganese acetate and/or calcium acetate as a catalyst,
a polymerization process in which a polymerization is performed after an alkali metal phosphate of 0.5 mol/t or more and 3.0 mol/t or less is added to a composition obtained by the ester exchange process and a phosphorus acid of 0.4 times or more and 1.5 times or less in terms of the number of moles relative to the alkali metal phosphate is added,
a biaxial orientation process in which, when a glass transition temperature of polyester composition is denoted by Tg (° C.), a polyester composition which is obtained by the polymerization process and is formed into a sheet shape is oriented biaxially and successively at a temperature in a range from Tg° C. or higher to Tg+40° C. or lower by an area multiplier of 14 or more,
a heat treatment process in which, when a melting point of polyester composition is denoted by Tm (° C.) and a heat treatment temperature is denoted by Th (° C.), the heat treatment process is performed subsequent to the biaxial stretching process under conditions where the following Equation (iii) is satisfied, and
a layering process in which the film is set to be layer a (core layer), a layer (layer b1) of either a sheet containing polyarylene sulfide as a main component or a sheet containing aramid as a main component is layered on one side of layer a, and a layer (layer b2) of either a sheet containing polyarylene sulfide as a main component or a sheet containing aramid as a main component is layered on other side of the layer a:

$$45 \leq Tm-Th \leq 90. \quad (iii)$$

It becomes possible to provide a polyester composition and a film which satisfy moist-heat resistance over a long period of time. Furthermore, by using the film, it becomes possible to provide an electrical insulation sheet having high moist-heat resistance. Furthermore, by using the film, it becomes possible to provide a solar cell back sheet having high moist-heat resistance.

DETAILED DESCRIPTION

The polyester composition comprises polyester as a main component, and it is necessary for the polyester composition to meet the following requirements from (1) to (3):
(1) The polyester composition contains phosphoric acid and alkali metal phosphate, and the phosphorus content P is 1.8 mol/t or more and 5.0 mol/t or less relative to the whole amount of polyester composition.

(2) The polyester composition contains at least one metal element of Mn and Ca, and the amount of any divalent metal other than Mn and Ca is 5 ppm or less relative to the whole of the polyester composition.

(3) When an alkali metal element content relative to the whole of polyester composition is denoted by M1 (mol/t), and a total amount of Mn element content and Ca element content relative to the whole of polyester composition is denoted by M2 (mol/t), a metal element content M (mol/t) in the polyester composition which is calculated by expression (i) below and the phosphorus element content P (mol/t) satisfy expression (ii) below:

$$M=(M1)/2+M2 \qquad (i)$$

$$1.1 \leq M/P \leq 3.0. \qquad (ii)$$

It is necessary for the polyester composition to comprise polyester as a main component. "A polyester composition comprising polyester as a main component" means that the composition contains at least 80 wt % of polyester. The polyester content is preferably at least 90 wt %, more preferably 95 wt %, particularly preferably 98 wt %. The polyester mentioned herein comprises a dicarboxylic acid component and a diol component. In this application, "component" means a minimum unit which can be obtained by hydrolysis of the polyester.

Representative dicarboxylic acid components constituting such a polyester include, but are not limited to, aliphatic dicarboxylic acid group, alicyclic dicarboxylic acid group, aromatic dicarboxylic acid group and those ester derivatives. The aliphatic dicarboxylic acid group includes, for example, malonic acid, succinic acid, glutaric acid, adipic acid, suberic acid, sebacic acid, dodecanedioic acid, dimer acid, eicosanedioic acid, pimelic acid, azelaic acid, methylmalonic acid, and ethyl malonic acid. The alicyclic dicarboxylic acid group includes, for example, adamantane dicarboxylic acid, norbornene dicarboxylic acid, isosorbide, cyclohexane dicarboxylic acid, and decalin dicarboxylic acid. The aromatic dicarboxylic acid group includes, for example, terephthalic acid, isophthalic acid, phthalic acid, a 1,4-naphthalene dicarboxylic acid, a 1,5-naphthalene dicarboxylic acid, a 2,6-naphthalene dicarboxylic acid, a 1,8-naphthalene dicarboxylic acid, 4,4'-diphenyl dicarboxylic acid, 4,4'-diphenyl ether dicarboxylic acid, 5-sulfoisophthalic acid sodium salt, phenylindane dicarboxylic acid, anthracene dicarboxylic acid, phenanthrene dicarboxylic acid, and 9,9'-bis(4-carboxy phenyl) fluorene acid.

Furthermore, representative diol components constituting such polyester include, but are not limited to, aliphatic diol group, alicyclic diol group, aromatic diol group, and oligomers consisting of a plurality of these diols. The aliphatic diol group include, for example, ethylene glycol, 1,2-propanediol, 1,3-propanediol, 1,4-butanediol, 1,2-butanediol, and 1,3-butanediol. The alicyclic diol group includes, for example, cyclohexanedimethanol, spiroglycol, and isosorbide. The aromatic diol group include, for example, bisphenol A, 1,3-benzene dimethanol, 1,4-benzene dimethanol, and 9,9'-bis(4-hydroxyphenyl) fluorene.

In the polyester composition, polyester, the main component, is preferably a polyester in which main components are terephthalic acid and ethylene glycol, or a polyester in which main components are 2,6-naphthalene dicarboxylic acid and ethylene glycol, from the viewpoint of mechanical properties, crystallization characteristics and moisture-heat resistance.

The polyester in which main components are terephthalic acid and ethylene glycol means that the ratio of terephthalic acid components is 90 to 100 mol %, preferably 95 to 100 mol % relative to the whole amount of dicarboxylic acid components, and that the ratio of ethylene glycol components is 90 to 100 mol %, preferably 95 to 100 mol % relative to the whole amount of diol components. If the ratio of terephthalic acid components is less than 90 mol % and/or the ratio of ethylene glycol components is less than 90%, there may be a deterioration in mechanical properties, crystallization characteristics and moisture-heat resistance. Furthermore, the polyester in which main components are 2,6-naphthalene dicarboxylic acid and ethylene glycol means that the ratio of 2,6-naphthalene dicarboxylic acid components is 90 to 100 mol %, preferably 95 to 100 mol % relative to the whole amount of dicarboxylic acid components, and that the ratio of ethylene glycol components is 90 to 100 mol %, preferably in a range of 95 to 100 mol % relative to the whole amount of diol components. If the ratio of 2,6-naphthalene dicarboxylic acid components is less than 90 mol % and/or the ratio of ethylene glycol components is less than 90%, there may be a deterioration in mechanical properties, crystallization characteristics and moisture-heat resistance.

Preferably, the polyester, which is the main component of the above-described polyester composition, contains copolymerization components, which are ingredients having at least three carboxylic acid groups and/or hydroxyl groups, of 0.025 to 1.5 mol % relative to the whole amount of polyester components. The ingredients having at least three carboxylic acid groups and/or hydroxyl groups denote ingredients having at least three carboxylic acid groups in a molecule, having at least three hydroxyl groups in a molecule, or having at least three carboxylic acid groups and at least three hydroxyl groups in a molecule.

When the ingredients having at least three carboxylic acid groups and/or hydroxyl groups are copolymerized, cross-links are formed among molecule chains by these multifunctional group ingredients. It is preferred because the cross-links make the movement of molecules restricted and make the hydrolysis more regulated. Representative ingredients having at least three carboxylic acid groups and/or hydroxyl groups include multifunctional carboxylic acids such as trimellitic acid, cyclohexane tricarboxylic acid, biphenyl tetracarboxylic acid, pyromellitic acid, butane tetracarboxylic acid and trimer acid consisting of aliphatic acid trimer, anhydrides and esters of these multifunctional carboxylic acids, polyols such as glycerin, pentaerythritol, dipentaerythritol, trimethylol propane, di trimethylol propane and trihydroxy hexane, multifunctional hydroxycarboxylic acids such as citric acid, dihydroxy benzene carboxylic acid and dihydroxy naphthalene carboxylic acid, and anhydrides and esters of these multifunctional hydroxycarboxylic acids. Particularly, it is preferable to be a component having at least three carboxylic acid groups and/or hydroxyl groups from the viewpoint of moisture-heat resistance and film moldability.

It is necessary for the above-described polyester compound to contain alkali metal phosphate salt and phosphoric acid as phosphorus compound. Representative alkali metal phosphate salts include sodium dihydrogen phosphate, disodium hydrogen phosphate, trisodium phosphate, potassium dihydrogen phosphate, dipotassium hydrogen phosphate, tripotassium phosphate, lithium dihydrogen phosphate, dilithium hydrogen phosphate, and trilithium phosphate. Preferably, alkali metal dihydrogen phosphate or di-(alkali metal) hydrogen phosphate is used. Further, from the viewpoint of long-term moisture-heat resistance, alkali metal phosphate salt in which alkali metal is sodium or potassium is preferably used. Particularly preferably, sodium dihydrogen phosphate or potassium dihydrogen phosphate is used.

It is necessary for the above-described polyester composition that the phosphorus content P is 1.8 to 5.0 mol/t relative to the whole amount of the polyester composition. Further, it is necessary for the above-described polyester composition that at least one metal element of Mn and Ca is contained and the content of other divalent metal element is at most 5 ppm relative to the whole amount of polyester composition. The metal element includes not only atoms but also ions existing in the polyester component. In polyester composition, the metal element generally exists as an ion state.

In addition, it is necessary that metal content M (mol/t) which follows (i)-type, is demanded and content P (mol/t) of the phosphorus element meet follows type (ii) when the polyester compositions mentioned above assume the content of the alkali metallic element for the whole polyester compositions M1 (mol/t), and it does the total of Mn element content and the Ca element content for the whole polyester compositions with M2 (mol/t):

$$M=(M1)/2+M2 \quad \text{(i)}$$

$$1.1 \leq M/P \leq 3.0. \quad \text{(ii)}$$

The divalent metal element described above includes alkaline earth metals up to 3rd period of the periodic table, elements of group 1 to 12 in 5th and subsequent period, and transition metal elements in 4th period except Ti. The valence number of a metal element means the total number of electrons present in s-orbital which is the outermost shell or the nearest thereto.

Mn element and Ca element included in the polyester composition have to be a metal compound containing these metal elements. Such a metal compound have a function as an ester exchange reaction catalyst.

Preferably, the polyester composition contains a metal compound containing at least one metal element selected from a group consisting of Na, Li and K and a metal compound containing at least one metal element selected from a group consisting of Sb, Ti and Ge, and the total amount of these metal elements contained is 30 to 2000 ppm relative to the whole amount of the polyester composition. By regulating the total amount of the metal elements contained within this range, it becomes possible to reduce the quantity of COOH end group and to improve heat resistance. Na, Li and K are alkali metal elements. Furthermore, Sb, Ti and Ge are metal elements having polymerization catalyst capability and function as a polymerization catalyst.

As described above, the polyester composition contains both alkali metal phosphate salt and phosphoric acid as phosphorus compounds. According to such a configuration, the activity of COOH end group of the polyester decreases by buffer action, the hydrolysis under moisture-heat condition is reined in, and consequently heat-moisture resistance improves remarkably.

In the polyester composition described above, it is necessary for phosphorus element content P to be 1.8 to 5.0 mol/t relative to the whole amount of the polyester composition. If phosphorus element content P is less than 1.8 mol/t, because the alkali metal phosphate salt and phosphoric acid are not contained sufficiently, it is not possible to regulate the increase of COOH end group under moisture-heat atmosphere, the hydrolysis of the polyester composition tends to occur and there is a fear that the moisture-heat resistance may be deteriorated. Furthermore, if phosphorus element content P is more than 5.0 mol/t, the amount of alkali metal phosphate salt and/or phosphoric acid becomes excessive. If the alkali metal phosphate salt is excessive, there is a concern that the alkali metal phosphate salt may heterogenize. If the phosphoric acid is excessive, the polymerization reaction is delayed by the phosphoric acid deactivating the polymerization catalyst, the quantity of COOH end group increases, and thus the moisture-heat resistance of the polyester composition may deteriorate. Preferably, from the viewpoint of moisture-heat resistance, the alkali metal phosphate salt content in the polyester composition is 1.3 to 3.0 mol/t with reference to the whole of polyester composition. Furthermore, from the viewpoint of long-term moisture-heat resistance, the amount of phosphoric acid content is preferably 0.4 to 1.5 times as many moles as that of alkali metal phosphate salt.

The alkali metal element, Mn element and Ca element which are contained in the polyester composition form chemical bond with COOH end group of a compound containing phosphorous element or of a polyester, and consequently produce effects of suppressing the polymerization catalyst deactivation caused by phosphorus compounds and of suppressing the hydrolysis by restraining the autocatalysis of the COOH end group. The alkali metal elements are effective in restraint of the deactivation of the polymerization catalyst, and the Mn element and Ca element are effective in restraint of the deactivation of the polymerization catalyst and in restraint of the hydrolysis by restraining the autocatalysis of the COOH end group.

Generally, metal ions contained in polyester composition form chemical bond with carbonyl groups including COOH end group. In the case where a metal ion form a chemical bond with a carbonyl group of COOH end group, the autocatalysis of COOH end group occurs due to the presence of water molecules, the hydrolysis occurs, and the polyester deteriorates. To suppress the hydrolysis, it is effective to stabilize both metal ions forming chemical bond with COOH end group and water molecules. In other words, it is effective to cause hydration between metal ions and water molecules. As an index of this effect, it is possible to use a product which is the result of multiplying the hydrate enthalpy of metal ion by the radius of metal ion. Representative metal elements in which the product is high include Mn, Ca and Al ions. These metal ions can stabilize water molecules more efficiently, and consequently can improve moisture-heat resistance of the polyester composition. Particularly, Mn element and Ca element are preferred as metal elements to be contained because compounds containing those elements have high performance as ester exchange reaction catalyst.

Furthermore, because phosphorus compounds exist as anions in the polyester composition, phosphorus compounds form chemical bond with metal elements which exist as ions in the polyester composition. When an anion originating from phosphorus compound forms a chemical bond with a metal element ion originating from polymerization catalyst, the polymerization catalyst is deactivated. By introducing metal ions other than those originating from polymerization catalyst into the polyester composition, it becomes possible to restrain metal ions originating from polymerization catalyst from forming chemical bond with anions originating from phosphorus compounds, and it becomes possible to suppress the deactivation of the polymerization catalyst. The M/P depicted in the above-described Equation (ii) can be used as an index of suppressing deactivation of polymerization catalyst caused by phosphorus compounds or of suppressing autocatalysis of COOH end groups in polyester compounds. In this equation, M denotes the amount of metal element content forming chemical bond with anions derived from phosphorus compounds in polyester composition. However, because the anions derived from phosphorus compounds in the polyester composition are divalent, these anions interact one-to-one with divalent metal cations. Therefore, it is necessary to be multiplied by coefficient 0.5 for the amount of univalent metal element content M1, because such metal elements become univalent anions in the polyester composition.

In the polyester composition described above, M/P has to be 1.1 to 3.0. If M/P is less than 1.1, because the amount of metal element content relative to phosphorus compounds is too small to suppress the deactivation of polymerization catalyst caused by phosphorus compounds and to suppress the autocatalysis of COOH end groups in the polyester composition, it is difficult to restrain the increase of quantity of COOH end groups during polymerization and to restrain the hydrolysis reaction under moisture-heat atmosphere, and there is a concern that moisture-heat resistance may deteriorate. Furthermore, if M/P exceeds 3.0, compounds containing metal elements become superabundant and may heterogenize. By letting M/P be in the above-described range, it becomes possible to produce polyester compositions containing few heterogenous matters and having excellent moisture-heat resistance. More preferably, M/P is 1.15 to 1.4.

In the above-described polyester composition, as described above, any divalent metal element content except Mn and Ca is equal to or less than 5 ppm in comparison with the whole of polyester compositions. If any divalent metal element content except Mn and Ca exceeds 5 ppm in comparison with the whole of polyester composition, it may prevent Mn elements and Ca elements from suppressing the deactivation of polymerization catalyst and from suppressing the autocatalysis of COOH end groups, and there is a concern that moisture-heat resistance may deteriorate. More preferably, the total of all divalent metal element content except Mn and Ca is equal to or less than 5 ppm.

In the polyester composition described above, from the viewpoint of mechanical characteristics and heat resistance, the intrinsic viscosity is preferably 0.6 to 1.0, more preferably 0.7 to 0.9.

In the polyester composition described above, from the viewpoint of moisture-heat resistance, the quantity of COOH end groups is preferably less than or equal to 15 eq./t (equivalent/ton), more preferably less than or equal to 12 eq./t.

The polyester composition described above may contain additives such as heat-resistant stabilizer, anti-oxidation stabilizer, ultraviolet absorbent, anti-ultraviolet stabilizer, organic/inorganic lubricant, organic/inorganic microparticle, filler, nucleating agent, pigment, dispersant, and coupling agent, as long as the desired effect is not compromised.

Our films have a layer (the P layer) comprising the above-described polyester composition. The P layer can be a layer (the P' layer) containing the above-described polyester composition and pigment.

When the above-described pigment is a white pigment, the amount of pigment content is preferably 1 to 20 wt. % in comparison with the whole P layer. As the white pigment, barium sulfate and titanium oxide are preferred from the viewpoint of stability against ultraviolet rays (UV resistance), and rutile-type titanium oxide is preferred particularly from the viewpoint of UV resistance and moist-heat resistance. If content does not reach 1% by weight, UV resistance cannot be exhibited sufficiently. If content exceeds 20% by weight, moist-heat resistance may be deteriorated.

When the above-described pigment is a black pigment, the amount of pigment content is preferably 0.5 to 5 wt. % in comparison with the whole P layer. As the black pigment, carbon black is preferred from the viewpoint of UV resistance and moist-heat resistance. If content does not reach 0.5% by weight, there is a fear that UV resistance is not sufficient, and if content exceeds 5% by weight, there is a fear that moist-heat resistance may be deteriorated.

In the film described above, the thickness of the P layer is preferably 10 to 500 μm, more preferably 20 to 300 μm. Still more preferably, the thickness is 25 to 250 μm. Furthermore, it can also be applied to the above-described P' layer.

The total thickness of the film described above is preferably 10 to 500 μm, more preferably 20 to 300 μm. Still more preferably, it is 25 to 250 μm. In the film described above, from the viewpoint of moisture-heat resistance, the ratio of the thickness of the P layer to the total thickness of the film is preferably at least 50%, more preferably at least 70%, still more preferably at least 80%. And most preferably, the film consists only of the P layer. Furthermore, it can also be applied to the above-described the P' layer.

In the film described above, from the viewpoint of higher moisture-heat resistance, it is preferred that the polyester is biaxially oriented.

The above-described polyester composition and the film comprising thereof have a high moisture-heat resistance, and are suitable for the uses where moisture-heat resistance is important, such as solar cell back sheet, electric insulation material for water heater motor, automobile air-conditioning motor used in hybrid cars, electric insulation material for driving motor, material for capacitors, automobile material, and construction material. In these uses, the polyester composition and the film are suitable for the films for solar cell back sheet and the insulation materials for motors, and are particularly suitable for insulation materials for motors.

The sheet-like structure is a sheet-type structure wherein the film is used as core layer (layer a), a layer (layer b1) comprising either a sheet containing polyarylene sulfide as a main component or a sheet containing aramid as a main component is laminated on one side of the layer a, and a layer comprising either a sheet containing polyarylene sulfide as a main component or a sheet containing aramid as a main component is laminated on the other side of the layer a. Such a structure makes it possible to produce an electric insulation sheet having high heat resistance, moist-heat resistance and moldability.

The sheet containing polyarylene sulfide as a main component, which is used for layer b1 and/or b2 in the above-described sheet-type structure, means that the sheet contains at least 80 wt % of homopolymers or copolymers having repetition units of —(Ar—S)— relative to the whole of resin ingredients constituting the sheet. In the sheet-like structure, the amount of content is preferably at least 90 wt. %, more preferably at least 95 wt. %, particularly preferably at least 98 wt. %. The above-described Ar includes constituent units such as (A)-(K) shown in the following Formula (1). (In the following Formula (1), R1 and R2 are substitution group selected from hydrogen, alkyl group, alkoxy group and halogen group, and R1 can be equal to or different from R2.)

Formula (1)

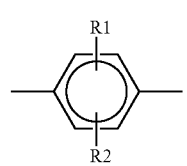

(A)

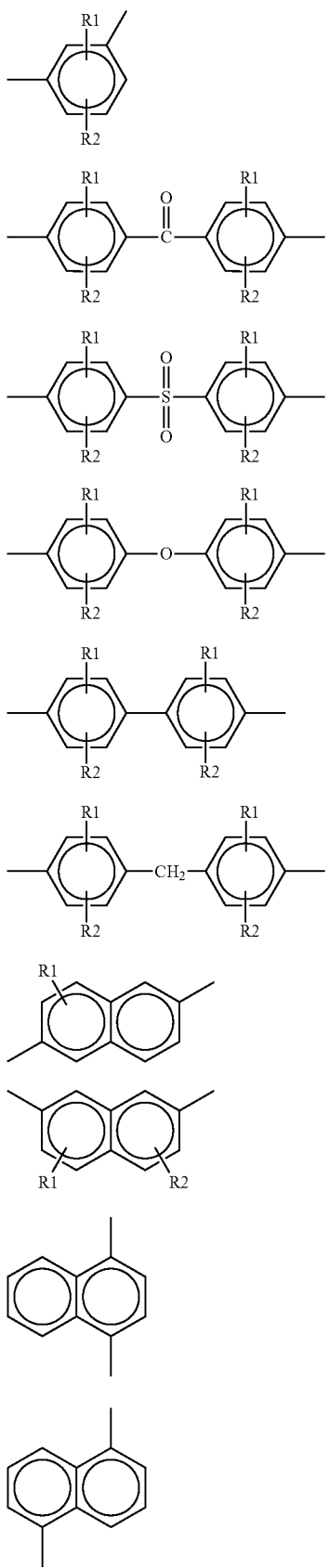

In the sheet-like structure described above, it is preferred that the repeat unit of polyarylene sulfide used in layer b1 and/or layer b2 is a constituent unit depicted in the above-described Formula (1), and representative constituent units include polyphenylene sulfide, polyphenylene sulfide sulfone, polyphenylene sulfide ketone, random copolymers or block copolymers of those, and mixtures thereof. As a particularly favorable polyarylene sulfide, polyphenylene sulfide is preferably used from the viewpoint of resin moldability and economical efficiency in polymerization process.

The sheet-like structure described above contains preferably at least 80 mol %, more preferably at least 90 mol %, still more preferably at least 95 mol %, of para-arylene sulfide unit depicted in the following Formula (2) as the above-described repeat unit of polyarylene sulfide. If the amount of para-arylene sulfide unit is less than 80 mol %, the crystallization characteristics and glass transition temperature of the resin become low, and the polyarylene sulfide's characteristics such as heat resistance, dimension stability and mechanical properties may be spoiled.

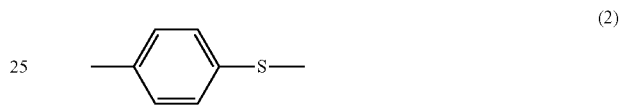
(2)

In the sheet-like structure, the sheet containing polyarylene sulfide as a main component can be fiber sheet, non-oriented sheet and a sheet oriented in at least one or more directions, and, from the viewpoint of heat-resistance and formability, is preferably a biaxially oriented sheet.

The sheet containing aramid as a main sheet, which is used for layer b1 and/or b2 in the above-described sheet-like structure, means a sheet containing at least 80 wt % of aromatic polyamides containing repetition units shown in the following Formula (3) and/or Formula (4) relative to the whole of resin ingredients constituting the sheet. In the above-described sheet-like structure, the amount of the aromatic polyamide content is preferably at least 90 wt. %, more preferably at least 95 wt. %, particularly preferably at least 98 wt. %.

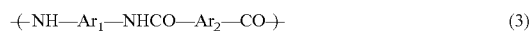 (3)

 (4)

Representative functional groups used as Ar1, Ar2 or Ar3 include (L)-(P) shown in the following Formula 5:

Formula (5)

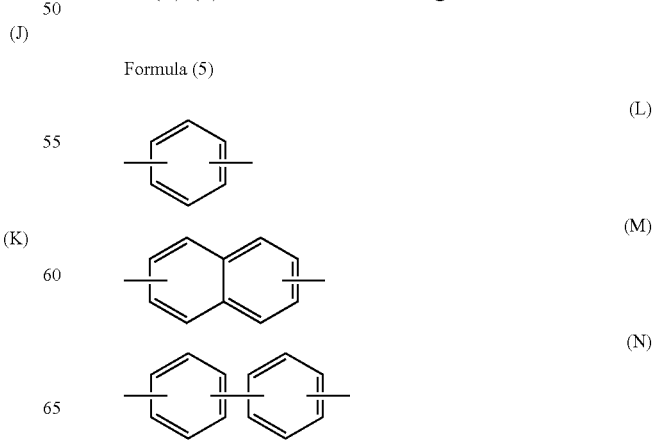

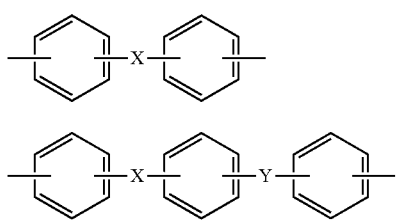

(O)

(P)

Further, functional groups X and Y can be selected from following groups:
Group A: —O—, —CO—, —CO$_2$—, —SO$_2$—
Group B: —CH$_2$—, —S—, —C(CH$_3$)$_2$—.

In the aromatic polyamide used for layer b1 and/or b2 in the sheet-like structure, the above-described aromatic ring having meta-orientation is preferably at least 80 mol %, more preferably at least 90 mol % in relation to the total aromatic rings. Furthermore, it is preferred that the aromatic polyamide contains at least 80 mol % of repeat units shown in the following Formula (6) from the viewpoint of excellent heat resistance and mechanical properties:

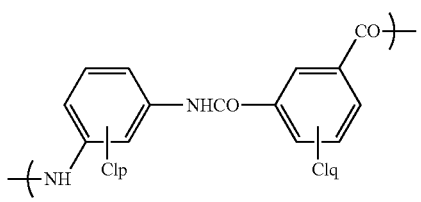

(Where, p and q are integers from 0 to 4).

In the above-described sheet-like structure, a sheet configured with aramid fibers can be used suitably from the viewpoint of heat resistance and mechanical properties.

In the above-described sheet-like structure, it is also preferred that an adhesion layer (layer c) is intervened between layer a and layer b1 and/or between layer a and layer b2.

The adhesion layer referred to herein means a layer which can enhance the adhesion property between layer a and layer b1 and/or adhesion property between layer a and layer b2 by being laminated between layer a and layer b1 and/or between layer a and layer b2.

For a compound used in the layer c, various resins such as epoxy-based compound, isocyanate-based compound, acryl-based compound, urethane-based compound, adhesive, olefin-based compound, polyester-based compound, polyamide-based compound, and polyimide-based compound can be used in various forms, i.e., resin itself, mixture, compound, and modified compound, and can be used in solution systems and non-solvent systems.

As a compound used in the above-described layer c, epoxy-based compound is preferably used from the viewpoint of heat-resistance and ease of handling. The epoxy-based compound is not particularly limited as long as the compound has at least 2 epoxy groups in a molecule, and representative epoxy-based compounds include bisphenol A type epoxy-based compound, bisphenol F type epoxy-based compound, biphenol type epoxy-based compound, and novolac type epoxy-based compound. Furthermore, to impart incombustibility, it is effective to use halogenated epoxy-based compound, particularly brominated epoxy-based compound.

However, when brominated epoxy-based compound is used singly, heat-resistance of adhesive is deteriorated considerably whereas the incombustibility is imparted. Therefore, it is further effective to utilize brominated epoxy-based compound as a mixture system in which non-brominated epoxy-based compound is mixed. Furthermore, it is possible to mix 2 or more compounds in consideration of bromine content and epoxy equivalent.

Furthermore, it is preferable to use curing agent for compounds used for layer c. Representative curing agents include amine-based compounds such as dicyandiamide, diaminodiphenylmethane, diaminodiphenylsulfide, diaminobenzophenone, diaminodiphenylsulfone and diethyltriamine, imidazole derivatives such as 2-alkyl-4-methyl imidazole, 2-phenyl-4-alkyl imidazole, 2-phenyl-4-alkyl imidazole and 1-cyanoethyl-2-methyl imidazole, chemical compounds such as 1,8-diazabicyclo[5,4,0]undecene and 7,1,4-diazabicyclo[2,2,2]octane, phosphorus-based compounds such as triphenyl phosphine and triethyl phosphine, aromatic tertiary amines such as benzyl dimethylamine, 2-(dimethylamino) phenol and 2,4,6-tris(diaminomethyl)phenol, alicyclic tertialy amines such as dimethyl cyclohexylamine, organic acids such as phthalic anhydride, trimellitic anhydride and pyromellitic acid, boron trifluoride-amine complexes such as boron trifluoride triethyl amine complex and boron trifluoride piperazine complex, trichloride amine complexes, phosphorus pentafluoride, arsenic pentafluoride, antimony pentafluoride, boron tetrafluoride amine salt, and metal fluoroborates such as zinc fluoroborate and tin fluoroborate. These curing agents can be used singly or in combination. For the curing agent, it is possible to use phenol resin such as resol type or novolac type phenol resin. Representative phenol resins include, e.g., phenol, biphenol, cresol, alkyl substituted phenol such as p-t-butyl phenol, terpene, cyclic alkyl substituted phenol such as dicyclopentadiene, resins having a functional group containing heteroatom such as nitro group, halogen group, amino group and cyano group, and resins having a structure of naphthalene, anthracene and the like. The amount of addition of curing agent is preferably 0.01 wt. % or more and 50 wt. % or less relative to the whole compound forming layer c. If the amount is less than 0.01 wt. %, curing is insufficient and it is not possible to achieve adequate heat resistance. If the amount is greater than 50 wt. %, there is a fear that adhesiveness may be deteriorated because coating layer becomes fragile. It is particularly preferable to use aromatic polyamine such as diamino diphenyl methane, diamino diphenyl sulfide, diamino benzophenone, and diamino diphenyl sulfone to achieve good heat-resistance.

As a method of layering adhesive layer (layer c), it is possible to employ known methods, e.g., coating methods such as gravure coater method, reverse coater method and die coater method, and laminate methods such as dry laminate method and extrusion laminate method and the like.

When laminating the above-described film (layer a) and the sheet containing polyarylene sulfide as a main component (layer b1 and/or layer b2) by coextrusion, it is preferable to add polyether imide to layer a in a range of 10 to 20 wt. % in comparison with the whole layer a from the viewpoint of stackability and moldability. Polyetherimide referred to herein contains aliphatic, alicyclic or aromatic ether units and alicyclic imide groups as repeat units, and preferably, the polymers shown in the following Formula (7) are used:

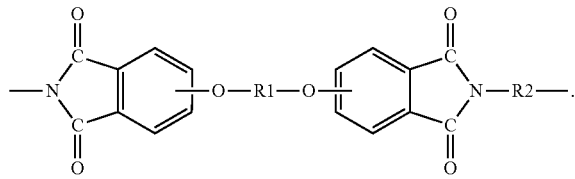

(7)

In the above-described Formula (7), R1 means a divalent aromatic or aliphatic residual group having 6-30 carbon atoms, R2 means a divalent organic group selected from a group consisting of a divalent aromatic residual group having 6-30 carbon atom, an alkylene group having 2-20 carbon atoms, a cycloalkylene group having 2-20 carbon atoms, and a polydiorganosiloxane group in which the polymerization is terminated by an alkylene group having 2-8 carbon atoms.

If quantity of addition of the polyetherimide is less than 10 wt. % relative to the whole layer a, the stackability is deteriorated and there is a possibility that exfoliation may occur between layer a and layer b1 and/or between layer a and layer b2. If quantity of addition exceeds 20 wt. %, a tear tends to occur during coating, and there is a fear that moldability may be deteriorated.

In the sheet-like structure described above, it is preferred that A, the thickness of layer a, B1, the thickness of layer b1, and B2, the thickness of layer b2, meet the conditions in the following Equation (4):

$$0.1 \leq (B1+B2)/A \leq 4.0.$$

If the value of Equation (4) is less than 0.1, proportion of layer a comprising polyester composition becomes high, and there is a fear that it is not possible to use it under high-temperature conditions. If the value of Equation (4) exceeds 4.0, proportion of layer a comprising polyester composition becomes low, and there is a fear that the moldability may be deteriorated due to low tenacity. By regulating the value of Equation (4) to 0.1 to 4.0, it becomes possible to meet compatibility between thermal resistance and moldability.

When forming the above-described layer c in the sheet-like structure, the laminated thickness of c layer is preferably 0.1 to 30 µm. If the laminated thickness of the layer c is less than 0.1 µm, adhesive property between layers may not be improved sufficiently. If the laminated thickness of the layer c exceeds 30 µm, in the case where the sheet-like structure is used as an electric insulation sheet or the like, there is a fear that layer c may fuse, exfoliate and taint a process. More preferably, The laminated thickness of c layer is 0.2 to 20 µm, further more preferably 0.5 to 10 µm.

Furthermore, in the film (layer a) contained in the above-described sheet-like structure, it is preferred that planar orientation coefficient R in Raman band spectrum is 5.0 or more and 10.0 or less. The planar orientation coefficient R in Raman band spectrum is determined by focusing a laser beam to the film and measuring the peak intensity of Raman spectrum at 1615 cm$^{-1}$. First, an intensity in which laser polarization is arranged perpendicular to film plane direction (I(ND)), an intensity in a polarization arrangement parallel to longitudinal direction of film (I(MD)), and an intensity in a polarization arrangement parallel to transverse direction of film (I(TD)) are determined. In Raman spectrum, a Raman band at 1615 cm$^{-1}$ belongs to a C=C stretching vibration (vC=C) of benzene. Thus, each orientation coefficient in film longitudinal direction R(MD) and film width direction R(TD) is calculated by dividing I(MD) or I(TD) by I(ND), respectively. Furthermore, as described in the following equations, orientation coefficient in film planar direction (planar orientation coefficient) R is calculated as the average of R(MD) and R(TD):

$$R=(R(MD)+R(TD))/2$$

$$R(MD)=I(MD)/I(ND)$$

$$R(TD)=I(TD)/I(ND).$$

Generally, in a film constituting a layer, i.e., a polyester film produced from crystalline polyester such as polyethylene telephthalate and polyethylene 2,6-naphthalate, crystalline region and amorphous region of polyester exist. Further, in a polyester film produced by extruding crystalline polyester film biaxially, a region where polyester is crystallized by arranging molecular chains in a extrusion direction (hereinafter, referred to as oriented crystalline region), a region where polyester is crystallized without orientation (hereinafter, referred to as crystalline region) and amorphous region exists. It is believed that the amorphous region has a lower density than the crystalline region and oriented crystalline region, and has a considerable average intermolecular distance.

When a polyester film is exposed under moist heat atmosphere, moisture (vapor) penetrates into the polyester through clearances between molecular chains in the amorphous region of low density, plasticizing the amorphous region and increasing movability of molecular chains. Furthermore, polyester has COOH end groups derived from its raw material, and due to the presence of the COOH end groups as an autocatalyst, the penetrating moisture causes hydrolysis in the amorphous region where molecular chains have relatively high movability. Due to the hydrolysis, the movability of molecular chains becomes higher as molecular mass reduces in the amorphous region, and the polyester of reduced molecular mass crystallizes in the amorphous region. It is considered that, as a result that the amorphous region turns into crystalline region, the embrittlement of the film progresses and makes the film so fragile that even a small impact causes a rupture.

If the planar orientation coefficient R is less than 5.0, the oriented crystalline region in the film constituting layer a is small, enlargement of the crystal tends to occur under moist heat atmosphere because the amorphous region does not tense and has high movability, and there is a fear that the film tends to become brittle. If the planar orientation coefficient is greater than 10.0, the oriented crystalline region becomes large, the amount of amorphous region becomes remarkably small when the amorphous region crystallizes under moist heat atmosphere, and there is a fear that the film tends to become brittle.

Next, the processes of producing polyester composition, film and sheet-like structure will be explained as referring to examples, although this disclosure is not particularly limited thereto.

Preferably, the process of producing a polyester composition includes the following process (5) and (6) in this order from the viewpoint of regulating the amount of COOH end groups:

(5) An ester exchange process of performing ester exchange reaction by using dimethyl ester of dicarboxylic acid and diol with acetic acid manganese salt and/or acetic acid calcium salt as catalyst.

(6) A polymerization process of performing polymerization after adding alkali metal phosphate salt in a range of 0.5 to 3.0 mol/t relative to the entire polyester compound to the compound produced in (5).

The process (5) (i.e., the ester exchange process) is a process of producing a composition containing polyester oligomers by performing an ester exchange reaction between dicarboxylic acid dimethyl ester and dialcohol using manganese acetate and/or calcium acetate as a reaction catalyst. The composition containing polyester oligomers referred to herein means a composition in which the intrinsic viscosity is less than 0.3. Because the polyester which is the main component of the polyester composition includes ingredients having carboxyl acid group and/or hydroxy group as copolymerization ingredients, in the process (5), it is preferable for the polyester to include ingredients having carboxyl acid group and/or hydroxy group of 0.025 to 1.5 mol % relative to the whole ingredients of the polyester.

The process (6) (i.e., the polymerization process) is a process of producing polyester composition by polymerizing polyester by adding phosphoric acid and alkali metal phosphate salt to ingredients including polyester oligomers which are produced in the process (5).

In the process (6), it is also suitable to add a polymerization catalyst such as ethylene glycol solution of germanium dioxide, antimony trioxide, titanium alkoxide and titanium chelate.

In the process (6), if the amount of addition of alkali metal phosphate salt is less than 1.3 mol/t relative to the whole amount of polyester compositions, there is a possibility that the long-term moisture-heat resistance may not be sufficient. Furthermore, if the amount of addition of alkali metal phosphate salt exceeds 3.0 mol/t relative to the entire polyester compositions, the product tends to be heterogeneous. Particularly, from the viewpoint of heat resistance and moist heat resistance, it is preferred that the alkali metal content is 1.3 mol/t or more and 6.0 mol/t or less, and from the viewpoint of heat resistance and moist heat resistance, it is necessary that the phosphorus element content is 1.8 mol/t or more and 5.0 mol/t or less. Furthermore, from the viewpoint of suppressing generation of heterogeneous matters and keeping moist heat resistance for a long period of time, it is preferred that the phosphoric acid is added to the alkali metal phosphoric salt in the process (6), wherein the amount of phosphoric acid is 0.4-1.5 times as many number of moles as that of alkali metal phosphate. More preferably, the ratio is 0.8 or more and 1.4 or less. If the ratio is less than 0.4, the long-term moist heat resistance may deteriorate. If the ratio exceeds 1.5, polymerization catalyst is deactivated because of excessive phosphoric acid, polymerization reaction becomes slow, the amount of COOH terminal group increases, and consequently moist heat resistance of the polyester composition may deteriorate.

From the viewpoint of the long-term moist heat resistance, it is preferred that the phosphoric acid and/or alkali metal phosphate salt is dissolved in ethylene glycol or the like, in advance, then mixed and added. In this case, from the viewpoint of heat resistance and moisture-heat resistance, the kind of the solvent or disperse medium is preferably the same alkylene glycol as a linear alkylene glycol being included in the polyester and having a carbon number of 2 to 4. If a different kind of alkylene glycol is used, it may be copolymerized and heat-resistance may deteriorate. Particularly, from the viewpoint of suppressing the generation of heterogeneous matters, it is preferable to regulate pH of the mixture solution in an acidic range of 2.0 to 6.0. More preferably, the pH is 4.0 or more and 6.0 or less. It is possible to add the phosphorus compounds either before or after the addition of polymerization catalyst, and it is preferred that the interval between the addition of the phosphorous compounds and the addition of the polymerization catalyst is at least 5 minutes.

In the process (6), it is preferred that the polymerization is performed until the intrinsic viscosity of the polyester composition becomes 0.5 or more. In the case where the intrinsic viscosity of the polymer composition is increased to 0.5 or more, from the viewpoint of further reducing the amount of COOH end group within a range of less than or equal to 20 eq./t, it is preferred that the polymerization reaction temperature is less than or equal to Tm+30° C.

To increase the intrinsic viscosity and reduce the amount of COOH end group, it is preferable in the process (6) to form chips at an intrinsic viscosity of 0.5 or more and 0.6 or less prior to performing solid-phase polymerization reaction. It is preferred that the solid-phase polymerization process is performed under conditions where the polymerization temperature is in a range from Tm−60° C. of the polyester composition to Tm−30° C. and the vacuum pressure is less than or equal to 0.3 Torr.

Next, the process of producing a film by using the above-described polyester composition will be explained.

In the case where the above-described film is configured to be a single film consisting only of layer P, it is possible to use a method (a melt cast method) in which a raw material of layer P is melted by heat in a die and is extruded from a tip onto a chill cast drum to form into a sheet-like shape. As other methods, it is also possible to use a method (a solvent cast method) of dissolving a raw material of layer P in a solvent, extruding the resulting solution from a tip onto a support member such as a cast drum and an endless belt to form into a film shape, and subsequently forming a sheet-like shape by dry removing the solvent from the film layer.

When producing layer P by the melt cast method, dry polyester compositions are melted and extruded into sheet shape from a tip by using an extruder, are cooled and solidified by being brought into intimate contact with a cooled drum at a surface temperature of 10 to 60° C., and a non-extruded sheet is formed as a result. By stretching the non-extruded sheet biaxially, the sheet can be obtained.

When melting and extruding by an extruder, melting is preferably performed under nitrogen atmosphere. As to the time between feeding chips to the extruder and extruding to a tip, the shorter is the better. As a guideline, the time is less than or equal to 30 minutes, preferably less than or equal to 15 minutes, more preferably less than 5 minutes from the viewpoint of suppressing the increase of COOH end groups.

The non-extruded sheet obtained is biaxially extruded at a temperature of Tg or higher. Methods of orienting biaxially include a sequential biaxially-orienting method in which the orientation in longitudinal direction is performed separately from the orientation in width direction, and a simultaneous biaxially-orienting method in which the orientations in longitudinal direction and in width direction are performed simultaneously.

To finish the crystalline orientation of the biaxially oriented film obtained and to enhance the flatness and measurement stability, a heat treatment is performed at a temperature of Tg or more and less than Tm for 1 second or more and 30 seconds or less. By cooling to room temperature after cooling slowly and homogeneously, our film can be obtained.

To set the planar orientation coefficient R of layer a in the sheet-like structure to the above-described value, it is preferred that the film is produced by a process including the following processes (7) and (8) in this order. Representative methods for evaluating Tg, Tm and Th include, e.g., differential scanning calorimetry.

(7) A biaxial orientation process in which, when a glass transition temperature of polyester composition is denoted by Tg (° C.), a polyester composition which is obtained by the polymerization process and is formed into a sheet shape is oriented biaxially and successively at a temperature of Tg° C. or more and Tg+40° C. or less by an area multiplier of 14 or more.

(8) A heat treatment process in which, when a melting point of polyester composition is denoted by Tm (° C.) and a heat treatment temperature is denoted by Th (° C.), the heat treatment process is performed subsequent to the biaxial stretching process under conditions where the following Equation (iii) is satisfied:

$$45° C. \leq Tm-Th \leq 90° C. \quad \text{(iii)}$$

If the orientation temperature is less than or equal to Tg, the orientation is not possible. If the orientation temperature exceeds Tg+40° C., there is a fear that the orientation of the film cannot be performed. If the area expansion rate is less than 14, the amount of oriented crystallization region is not sufficient, planar orientation coefficient becomes less than 5, and there is a fear that moist heat resistance may deteriorate. If heat-treatment temperature lowers down and falls outside the range of the equation (iii), polymer chains in the oriented crystallization region are not oriented adequately by the orientation, planar orientation coefficient becomes less than 5.0, and there is a fear that moist heat treatment resistance may deteriorate. By producing a film by using a method including the above-described processes (7) and (8) in this order, it becomes possible to regulate planar orientation coefficient R within the range described above, and it becomes possible to produce a biaxially oriented film having excellent moist heat resistance.

Next, a method to produce a sheet-like structure by using the above-described film will be explained.

To laminate the above-described film (layer a) with a sheet containing polyarylene sulfide as a main component (layer b1 and/or layer b2) in the sheet-like structure, several methods can be suitably used such as a method of intervening an adhesive layer (layer c) between layer a and layer b1 and/or layer a and layer b2, a method of co-extruding lamination by using at least 2 extruders, a melt lamination method, and a heat lamination method.

To laminate the above-described film (a layer) with a sheet containing aramid as a main component (b1 layer and/or b2 layer) in the sheet-like structure, several methods can be suitably used such as a method of intervening an adhesive layer (layer c) between layer a and layer b1 and/or layer a and layer b2, a heat lamination method, and a solution lamination method.

When layer a is laminated onto a sheet containing polyarylene sulfide as a main component and/or a sheet containing aramid as a main component by intervening an adhesive layer (layer c) therebetween, it is preferred that a coating method is used for forming layer c. In that case, it is possible to apply a method of laminating layer b1 and/or layer b2 after coating layer c on layer a, or a method for laminating layer a after coating layer c on layer b1 and/or layer b2. Afterwards, by performing a drying process and/or a curing process as needed, the above-described laminated sheet-like structure can be produced.

The following describes a case where a sheet-like structure having b1/a/b2 structure by co-extruding layer a and a sheet containing polyarylene sulfide as a main component (layer b1 and layer b2) with 2 extruders. After drying the above-described polyester composition and a composition comprising polyether imide (a composition forming layer a), the compositions are supplied to extruder 1 and melted by being heated at a temperature higher than the melting point of those compositions. Additionally, after drying a polyarylene sulfide resin (a resin forming layer b1 and layer b2), the resin is supplied to another extruder 2 and melted by being heated at a temperature higher than or equal to the melting point of the composition containing polyarylene sulfide as a main component. Those compositions and resins are laminated to form a b1/a/b2 structure in a molten state in a confluence device positioned between extruders and a tip, are extruded from the slit-shaped tip, are cooled and solidified by bringing into intimate contact with a chill drum by static electricity at a surface temperature in a range from 10° C. or higher to 60° C. or lower, and a non-extruded sheet-like structure is produced as a result.

This non-oriented sheet obtained is stretched biaxially at a temperature higher than or equal to Tg. Representative biaxial orientation methods include a sequential biaxial orientation method in which the longitudinal orientation and the transverse orientation are performed separately, and a simultaneous biaxial orientation method in which the longitudinal and transverse orientations are performed simultaneously.

To complete the crystal orientation of the biaxially oriented film and enhance the planar characteristics and size stability, a heat treatment is performed at a temperature which is higher than or equal to Tg of the polyester composition and is less than Tm. By cooling down to room temperature after cooling slowly and homogeneously, the above-described sheet-like structure is obtained.

The polyester composition obtained, a film comprising same and a laminated sheet-like structure comprising the film have remarkably excellent moist heat resistance. Therefore, the laminated sheet-like structure comprising this film is suitable for an electrical insulation sheet having excellent moist heat resistance.

Methods of Measuring and Evaluating Characteristics

Hereinafter, methods of measuring and evaluating characteristics will be explained.

The "sample" in A-E and L described below means polyester compositions. The "sample" in F and H is a film having a layer (layer P) comprising polyester compositions, a sheet-like structure which includes a film having a layer (layer P) comprising polyester compositions, or a solar cell back sheet which includes a film having a layer (P layer) comprising polyester compositions. The "sample" in G is a film having a layer (layer P) comprising polyester compositions. The "sample" in I-K is a sheet-like structure which includes a film having a layer (layer P) comprising polyester compositions. The "sample" in M and N is a polymer other than polyester compositions.

A. Method of Measuring Intrinsic Viscosity IV

A sample was dissolved in 100 ml of orthochlorophenol (concentration of solution=1.2 g/ml), and a viscosity of the solution at 25° C. is measured by using an Ostwald viscometer. Additionally, a viscosity of the solvent was measured in a similar manner. By using the solution viscosity and the solvent viscosity measured above, the intrinsic viscosity (IV) was determined as the value of [η] which was calculated on the basis of the following Equation (iv):

$$\eta sp/C = [\eta] + K[\eta]^2 \cdot C \quad \text{(iv)}$$

ηsp=(solution viscosity/solvent viscosity)−1, and K denotes Huggins constant (the value is 0.343).

B. Method for the Quantitative Determination of Phosphorus and Metal Elements Except for Alkali Metal Elements The amount of elements is determined by using a fluorescence X-rays analyzer (model number: 3270) supplied by Rigaku Corporation. 8 g of crashed frozen sample was used as an analytical sample according to JIS K 0119. The quantitative determination of each element contained in the sample was performed according to JIS K 0119 (1999) 10.1d).

C. Method for the Quantitative Determination of Alkali Metal Elements 1 g of sample was put on a platinum plate and was incinerated completely at 700° C. for 1.5 hours. By dissolving the incinerated matter in 0.1 N of hydrochloric acid, 50 ml of solution A was obtained. When there was no insoluble matter in solution A, it was used as a sample for the measurement. On the other hand, when there was an insoluble matter in solution A, a sample for the measurement was obtained as follows. 1 g of sample was newly put on a platinum plate, was incinerated completely for 1.5 hours at 700° C., and solution B was obtained by dissolving the incinerated matter in 6.5 N of nitric acid. By heating the solution B to evaporate nitric acid, residual substances were obtained. By dissolving the residual substances in hydrochloric acid of 0.1N so that the volume became 50 ml, solution B was obtained. This solution B was used as a measurement sample. Using the measurement sample described above, the quantitative measurement was carried out by atomic absorption analysis (supplied by Hitachi, Ltd.: polarized Zeeman atomic absorption spectrophotometer 180-80, flame: acetylene-air).

D. Method of Measuring the Quantity of COOH End Group

Maulice's method was used for measuring. (M. J. Maulice, F. Fuizinga, Anal. Chim. Acta, 22363 (1960))

E. Method of Measuring the Melting Point (Tm) of Polyester Compositions

In accordance with JIS K7121 (1999), the measurement of the sample was carried out using a differential scanning calorimetry "robot DSC-RDC220" supplied by Seiko Instruments Inc. and a disk session "SSC/5200" for data analysis. Measurements were carried out such that 5 mg of resin was weighed into a sample pan, heated from 25° C. to 300° C. at a temperature rise of 20° C./min. (1st RUN), kept still for 5 minutes, cooled rapidly to 25° C. or lower, and then heated again from room temperature to 300° C. at a temperature rise of 20° C./min. (2nd RUN). The melting point was determined as the peak top temperature of a crystal melting peak observed in the 2nd RUN. In the case where multiple peak tops were observed, the melting point shall be the highest peak top temperature.

F. Method of Measuring Fracture Elongation

In accordance with ASTM-D882 (1997), samples were cut into a size of 1 cm×20 cm, and fracture elongations of the samples were measured by pulling them in a chuck interval of 5 cm at a pulling speed of 300 mm/min. The number of the samples was n=5, the measurement was performed in both the longitudinal direction and the transverse direction, and the fracture elongations were determined as average values thereof.

G. Method of Measuring the Planar Orientation Coefficient R

Using T64000 supplied by Horiba Jovin Yvon Ltd., a laser light is irradiated to a sample with an Ar laser as a laser light source (514.5 nm, laser power 30 mW), and the peak intensity in the middle of thickness of the sample was determined at a Raman band spectrum of 1615 cm$^{-1}$. An intensity in which laser polarization is arranged perpendicular to film plane direction (I(ND)), an intensity in a polarization arrangement parallel to longitudinal direction of film (I(MD)), and an intensity in a polarization arrangement parallel to transverse direction of film (I(TD)) were determined. Next, each orientation coefficient in film longitudinal direction R(MD) and film width direction R(TD) was calculated by dividing I(MD) or I(TD) by I(ND), respectively. Furthermore, the average of R(MD) and R(TD) was calculated, and was denoted as the orientation coefficient R.

H. Method of Evaluating Moist Heat Resistance of Mechanical Properties

As to moist heat resistance of mechanical properties of films, samples were cut into a shape of measurement pieces (1 cm×20 cm), the measurement pieces were treated by a pressure cooker supplied by Tabai Espek (K.K.) under conditions at a temperature of 140° C. in a relative humidity of 80% RH, and subsequently fracture elongation was measured in accordance with the above-described F. The number of the samples was n=5, the measurement was performed in both the longitudinal direction and the transverse direction, and fracture elongations E1 was determined as the average value thereof. Furthermore, with regard to the film prior to the treatment, the fracture elongation E0 was measured as well in accordance with the above-described F, and by using the fracture elongations E0 and E1, the elongation retention rate was calculated in accordance with the following Equation (v). Moreover, the half-life of elongation was determined as a length of treatment time where the elongation retention rate became 50%.

$$\text{the elongation retention rate (\%)} = E1/E0 * 100 \quad (v)$$

The obtained half-life of elongation was rated as follows:
In the case where the half-life of elongation was more than 35 hours: S
In the case where the half-life of elongation was 30 hours or more and less than 35 hours: A
In the case where the half-life of elongation was 25 hours or more and less than 30 hours: B
In the case where the half-life of elongation was less than 25 hours: C.

S-B is rated as good, and S is the best among them.

In regard to the fracture elongation of the sheet-like structure, the fracture elongation of the sheet-like structure E0' was measured prior to the treatment, the fracture elongation of the sheet-like structure E1' was measured subsequent to the treatment under conditions at a temperature of 140° C. in a relative humidity of 80% RH, and fracture retention rate was calculated in accordance with the following Equation (v'). The measurement was performed in both the longitudinal direction and the transverse direction of the film of layer a constituting the sheet-like structure, and fracture elongations E1' was determined as the average value thereof. Furthermore, with regard to the sheet-like structure prior to the treatment, the fracture elongation E0' was measured as well in accordance with the above-described F.

$$\text{the elongation retention rate (\%)} = E1'/E0' * 100 \quad (v')$$

The obtained half-life of elongation was rated as follows:
In the case where the half-life of elongation was more than 40 hours: S
In the case where the half-life of elongation was 35 hours or more and less than 40 hours: A
In the case where the half-life of elongation was 30 hours or more and less than 35 hours: B
In the case where the half-life of elongation was less than 30 hours: C.

S-B is rated as good, and S is the best among them.

In regard to the fracture elongation of the back sheet, the fracture elongation of the back sheet E0" was measured prior to the treatment, the fracture elongation of the back sheet E1" was measured subsequent to the treatment under conditions at a temperature of 140° C. in a relative humidity of 80% RH, and fracture retention rate was calculated in accordance with the following Equation (v"). The measurement was performed in both the longitudinal direction and the transverse direction of the biaxially oriented film constituting the sheet-like structure, and fracture elongations E1" was determined as the average value thereof.

the elongation retention rate (%)=$E1''/E0''*100$ (v")

The obtained half-life of elongation was rated as follows:
In the case where the half-life of elongation was more than 35 hours: S
In the case where the half-life of elongation was 30 hours or more and less than 35 hours: A
In the case where the half-life of elongation was 25 hours or more and less than 30 hours: B
In the case where the half-life of elongation was less than 25 hours: C.

S-B is rated as good, and S is the best among them.

I. Method of Evaluating Heat Resistance

Samples were cut into a shape of measurement pieces (1 cm×20 cm), the measurement pieces were treated by a geer type oven at a temperature of 200° C., and subsequently fracture elongation was measured in accordance with the above-described F. The number of samples was n=5, the measurement was performed in both the longitudinal direction and the transverse direction of the film, and fracture elongation E"1 was determined as the average value thereof. Furthermore, with regard to the sheet-like structure prior to the treatment, the fracture elongation E"0 was measured as well in accordance with the above-described F, and by using the fracture elongations E"0 and E"1, the elongation retention rate was calculated in accordance with the following Equation (vi). Moreover, the half-life of elongation was determined as a length of treatment time where the elongation retention rate became 50%.

the elongation retention rate (%)=$E''1/E''0*100$ (vi)

The obtained half-life of elongation was rated as follows:
In the case where the half-life of elongation was 100 hours or more: A
In the case where the half-life of elongation was less than 100 hours: B.

A means good heat resistance.

J. Method of Evaluating Moist Heat Resistance of Electrical Properties

Samples were cut into a shape of measurement pieces (100 mm×100 mm), the measurement pieces were treated by a pressure cooker supplied by Tabai Espek (K.K.) under conditions at a temperature of 140° C. in a relative humidity of 80% RH, and subsequently volume resistivity (Ω·cm) was measured in accordance with JIS C 2318 6.3.6. The number of samples was n=3, and the volume resistivity was determined as the average value. The obtained volume resistivity was rated as follows:
In the case where the volume resistivity is more than $1.0*1.0^{16}$ Ω·cm: A
In the case where measurement became impossible because the sample was destroyed during measurement: B.

A is superior in moist heat resistance of electrical properties.

K. Method of Evaluating Processability

Using a motor processing machine (supplied by Odawara engineering Inc.), samples were stamped into a size of 12 mm×80 mm, 1000 samples were produced by putting a fold on samples at a total processing speed of 2 units/sec., the number of fractures and cracks in the samples was counted, and the result was rated as follows:
In the case where the number of fractures and cracks was less than 200: A
In the case where the number of fractures and cracks was 200 or more: B.

A has good processability.

L. Method of Measuring the Glass Transition Temperature (Tg) of Polyester Compositions In accordance with JIS K7121 (1999), by using a differential scanning calorimetry "robot DSC-RDC220" supplied by Seiko Instruments Inc. and a disk session "SSC/5200" for data analysis, the measurement was carried out as follows. 5 mg of sample was weighed in a sample pan, was heated from 25° C. to 300° C. at a temperature rise of 20° C./min., was kept still for 5 minutes, and was cooled rapidly to 25° C. or lower. Immediately afterward, the sample was heated again from room temperature to 300° C. at a temperature rise of 20° C./min., and the measurement was carried out. From a provided differential scanning calorimetry chart, the glass transition temperature was determined according to the method described in JIS K7121 (1999) 9.3 (1). In the case where multiple glass transition temperatures were provided, the highest glass transition temperature shall be the glass transition temperature of polyester compositions.

M. Method of Measuring the Melting Point of Polymer

In accordance with JIS K7121 (1999), by using a differential scanning calorimetry "robot DSC-RDC220" supplied by Seiko Instruments Inc. and a disk session "SSC/5200" for data analysis, the measurement was carried out as follows. 5 mg of resin was weighed into a sample pan, heated from 25° C. to 300° C. at a temperature rise of 20° C./min. (1st RUN), kept still for 5 minutes, cooled rapidly to 25° C. or lower, and then heated again from room temperature to 300° C. at a temperature rise of 20° C./min. (2nd RUN). The melting point was determined as the peak top temperature of a crystal melting peak observed in the 2nd RUN. In the case where multiple peak tops were observed, the melting point shall be the highest peak top temperature.

N. Method of Measuring the Glass Transition Temperature of Polymer

In accordance with JIS K7121 (1999), by using a differential scanning calorimetry "robot DSC-RDC220" supplied by Seiko Instruments Inc. and a disk session "SSC/5200" for data analysis, the measurement was carried out as follows. 5 mg of sample was weighed in a sample pan, was heated from 25° C. to 300° C. at a temperature rise of 20° C./min., was kept still for 5 minutes, and was cooled rapidly to 25° C. or lower. Immediately afterward, the sample was heated again from room temperature to 300° C. at a temperature rise of 20° C./min., and the measurement was carried out. From a provided differential scanning calorimetry chart, the glass transition temperature was determined according to the method described in JIS K7121 (1999) 9.3 (1). In the case where more than one glass transition temperature was provided, the highest glass transition temperature shall be the glass transition temperature of polymer.

EXAMPLES

Hereinafter, compositions, structures, sheets, back sheets and methods will be explained as referring to examples, but not particularly limited thereto.

Manufacture of PPS Raw Materials (PPS-1)

8267.37 g of sodium hydrogen sulfide with a 47.5% concentration (70.00 mol), 2957.1 g of sodium hydroxide with a 96% purity (70.97 mol), 11434.50 g of N-methyl-2-pyrrolidone (NMP) (115.50 mol), 2583.00 g of sodium acetate (31.50 mol) and 10500 g of ion exchanged water were put in a 70 L autoclave having a stirrer, heated gradually to 245° C. for approximately 3 hours at normal atmospheric pressure in a nitrogen atmosphere, and the reaction vessel was cooled to 160° C. after 14780.1 g of water and 280 g of NMP were distilled.

Next, 10235.46 g of p-dichlorobenzene (69.63 mol) and 9009.0 g of NMP (91.00 mol) were added, the reaction vessel was sealed under nitrogen atmosphere, and was heated to 238° C. at a temperature rise of 0.6° C./min. while being stirred at a speed of 240 rpm. After a reaction was performed for 95 minutes at 238° C., it was heated to 270° C. at a speed of 0.8 degrees per minute. After a reaction was performed for 100 minutes at 270° C., it was cooled to 250° C. at a speed of 1.3 degrees per minute while pumping 1260 g of water (70 mol) thereinto for 15 minutes. After being cooled to 200° C. at a speed of 1.0 degree per minute, it was rapidly cooled to approximately room temperature. After the content was taken out and washed, hydrated pps particles obtained were dried by hot air at 80° C. and were dried under a reduced pressure at 120° C. The resulting PPS had a glass transition temperature of 90° C. and a melting point of 285° C.

Example 1

100 parts by mass of dimethyl terephthalate, 57.5 parts by mass of ethylene glycol, 0.03 parts by mass of manganese acetate (1.35 mol/t in terms of Mn element) and 0.03 parts by mass of antimony trioxide were melted at 150° C. under nitrogen atmosphere. By heating this molten matter to 230° C. for 3 hours with stirring, methanol was evaporated and ester exchange reaction completed. After the ester exchange reaction completed, an ethylene glycol solution (pH 5.0) in which 0.005 parts by mass of phosphorus acid (equivalent to 0.52 mol/t) and 0.021 parts by mass of sodium dihydrogen phosphate dihydrate (equivalent to 1.30 mol/t) were dissolved in 0.5 parts by mass of ethylene glycol was added. This polyester composition had an intrinsic viscosity of less than 0.2. Afterwards, polymerization reaction was performed at a final temperature of 285° C. and a vacuum pressure of 0.1 Torr, and a polyethylene terephthalate having an intrinsic viscosity of 0.52 and an amount of COOH end group of 15 eq./t was obtained. The polyethylene terephthalate obtained was dried at 160° C. for 6 hours and was crystallized. Afterwards, solid-phase polymerization was performed for 8 hours at 220° C. and a vacuum pressure of 0.3 Torr, and a polyethylene terephthalate having an intrinsic viscosity of 0.85 and an amount of COOH end group of 10.2 eq./t was obtained. The polyethylene terephthalate composition obtained had a glass transition temperature of 82° C. and a melting point of 255° C.

After the solid-phase polymerization, the polyethylene terephthalate was supplied to an extruder under nitrogen atmosphere subsequent to vacuum-drying for 2 hours at 180° C. The polyethylene terephthalate was extruded from a T-die at an extrusion temperature of 280° C., was cooled rapidly by a casting drum (20° C.), and was formed into a sheet shape by an electrostatic method. The sheet was oriented in the longitudinal direction at an orientation temperature of 90° C. and an orientation ratio of 3.5 times, was oriented in the transverse direction at an orientation temperature of 100° C. and an orientation ratio of 4.2 times, was processed by heat at 200° C. for 8 seconds, and a biaxially oriented film having a thickness of 50 μm was obtained.

Next, as layer b1 and layer b2, an epoxy-based adhesive "KEMIT TE 2301" (supplied by Toray Fine Chemicals Co., Ltd.) was applied by a gravure roll to one side of polyphenylene sulfide (PPS) films (TORELINA, supplied by Toray Fine Chemicals Col, Ltd.) (layer c) having a thickness of 12 μm so that layer b1 and layer b2 had a thickness of 5 μm after drying. Furthermore, after laminating the biaxially oriented polyethylene film (layer a) having a thickness of 50 μm between PPS films (layer b1, layer b2) so that layer a was positioned as a center layer, an electrical insulation sheet (layer b1/layer c/layer a/layer c/layer b2) having a thickness of 84 μm was obtained by curing layer c at 150° C. for 1 hour. Evaluation of the obtained sheet was performed. The result is shown in Tables 1 and 11. According to the result, it is understood that the sheet has excellent characteristics.

Furthermore, using the biaxially oriented film (a film used as the above-described layer a) as the first layer, "TAKELAC" (registered trademark) A310 (supplied by Mitsui Takeda Chemical Inc.) and "TAKENATE" (registered trademark) A3 (supplied by Mitsui Takeda Chemical Inc.) were applied thereto as adhesive, and a biaxially oriented polyester film "Lumirror" (registered trademark) S10 (supplied by Toray Industries Inc.) having a thickness of 75 μm was adhered thereto as the second layer. Then, the above-described adhesive layer was applied onto the second layer, a Barrialox "HGTS" (alumina vapor-deposition PET film, supplied by Toray Advanced Film Co., Ltd.) having a thickness of 12 μm was adhered thereto such that the vapor-deposition layer became the opposite side of the second layer, and a back sheet was produced. For the back sheet obtained, evaluation of moist heat resistance of mechanical properties was performed. The result is shown in Tables.

Examples 2-11, 17, 18, 21, 22, 30-45, 47-50

Polyester composition was produced in a manner similar to Example 1 except that the composition of polyester compositions was changed as shown in Tables 1, 2, 3 and 5-10. The amount and kind of raw materials used was arranged so that the composition of polyester compositions can be obtained as described in Tables. For example, in the Examples wherein the amount of phosphorus element was changed, changed was the amount of addition of phosphoric acid and sodium dihydrogen phosphate which were added after the ester exchange reaction completed. Furthermore, in the Examples wherein polyester composition contained Ca element, calcium acetate was used instead of part or whole of manganese acetate. Furthermore, in the Examples wherein the kind of alkali metal salt was potassium, potassium dihydrogen phosphate was used instead of sodium dihydrogen phosphate added after the ester exchange reaction. Furthermore, in the Examples wherein the kind of alkali metal phosphate salt was replaced with trisodium phosphate, trisodium phosphate was used instead of sodium dihydrogen phosphate added after the ester exchange reaction. The glass transition temperature of polyethylene terephthalate obtained is shown in Tables 1, 2, 3 and 5-10. Furthermore, biaxially oriented films and electrical insulation sheets were obtained in a manner similar to Example 1. Furthermore, solar cell back sheets were obtained in a manner similar to Example 1. Evaluation of sheet characteristics was performed, and the evaluation result is shown in Tables 11-19. In Examples 5, 6, 10, 17, 18, 21, 22 and 30-45, the moist heat resistance of mechanical properties was better than that of Example 1, and other characteristics were as high as those of Example 1. Furthermore, in Examples 2-4, 7-9 and 11, it is understood that the characteristics were as high as those of Example 1.

Examples 12-16, 19, 20 and 46

Polymer compositions were obtained in a manner similar to Example 1 except that the composition of polyester compositions was changed by polymerizing ingredients shown in Tables 2, 3, 5 and 9 in accordance with the ratio described in these tables. More specifically, in Example 12, the ratio was changed to 99.87 parts by mass of dimethyl terephthalate, 0.13 parts by mass of trimethyl trimellitate and 57.5 parts by mass of ethylene glycol. Furthermore, in Example 16, the ratio was changed to 100 parts by mass of dimethyl terephthalate, 57.5 parts by mass of ethylene glycol and 0.047 parts by mass of glycerin. The glass transition temperature and melting point of the polyester compositions obtained were shown in Table 2, 3, 5 and 9. Next, biaxially oriented films were produced in a manner similar to Example 1 except that the orientation conditions were changed in accordance with Tables 2, 3, 5 and 9. Furthermore, electrical insulation sheets were obtained in a manner similar to Example 1. Furthermore, solar battery back sheets were obtained in a manner similar to Example 1. Evaluation of characteristics of the obtained sheets was performed, and the evaluation result is shown in Tables 12-14 and 18. It is understood that these sheets have higher moist heat resistance of mechanical properties than Example 1.

Examples 23-25

Biaxially oriented films were obtained in a manner similar to Example 1 except that the thickness of polyester film was changed in accordance with Table 14 and 15. Furthermore, electrical insulation sheets were obtained in a manner similar to Example 1 except that the thickness of "TORELINA", which was used for b1 layer and b2 layer, was changed in accordance with Table 14 and 15. Furthermore, solar battery back sheet were obtained in a manner similar to Example 1. Evaluation of characteristics of the obtained sheets was carried out, and the evaluation result is shown in Tables 3, 6, 14 and 15. It is understood that these sheets have high characteristics as in the case of Example 5.

Example 26

In the same manner as in Example 5 except that 100 parts by mass of dimethyl 2,6-naphthalene dicarboxylate was used instead of dimethyl terephthalate, Polyethylene-2,6-naphthalate (PEN) having an intrinsic viscosity of 0.90 and an amount of COOH end group of 12.5 eq./t was obtained. The obtained polyethylene-2,6-naphthalate had a glass transition temperature of 123° C. and a melting point of 265 degrees Celsius. The obtained polyethylene-2,6-naphthalate was dried in vacuum at 180 degrees Celsius and was supplied to an extruder under nitrogen atmosphere. Polyethylene-2,6-naphthalate was extruded from T-die at an extrusion temperature of 300 degrees Celsius, was cooled rapidly by a casting drum (20 degrees Celsius), and was formed into a sheet shape by an electrostatic method. The sheet was oriented in the longitudinal direction at an orientation temperature of 135° C. at an orientation ratio of 3.5 times, was oriented in the transverse direction at an orientation temperature of 140° C. at an orientation ratio of 4.2 times, was processed by heat at 230° C. for 8 seconds, and biaxially oriented film having a thickness of 50 μm was obtained. By using this film, electrical insulation sheets were obtained in a manner similar to Example 1. Furthermore, solar battery back sheets were obtained in a manner similar to Example 1. Evaluation of characteristics of the obtained sheets was carried out, and the evaluation result is shown in Tables 6 and 15. It is understood that these sheets have high characteristics as in the case of Example 5.

50 wt % of polyethylene terephthalate (PET) obtained in Example 5 and 50 wt % of polyetherimide (PEI) chip "Ultem" 1010 (having a glass transition temperature of 217° C. and an intrinsic viscosity of 0.68) supplied by General Electric were dried for 5 hours at 150° C., supplied to a vent type biaxial extruder having biaxial three-zone screws (PET and PEI kneading and plasticizing zone/Dulmage kneading zone/fine dispersing and compatibilizing zone by reverse flight Dulmage) and being heated at 320-290° C. (the temperature gradient was set in the screw zone and the extrusion head zone), melt-extruded with a retention time of 3 minutes, and PET/PEI brend chips containing 50 wt % of Ultem were obtained.

Next, 30 wt % of the obtained PET/PEI blend chips and 70 wt % of the PET chips obtained in Example 5 were mixed (PET and PEI mixing ratio, PET: 85 wt %, PEI: 15 wt %), dried under reduced pressure for 3 hours at 180° C., and supplied to extruder 1 in which the melt zone was heated to 280° C. On the other hand, a PPS material was dried under reduced pressure for 3 hours at 180 degrees, and supplied to extruder 2 in which the melt zone was heated to 320° C. These polymers having been melted in respective extruders were joined together by being supplied to a three-layer junction block at 290° C. so that a 3-layer laminate (b1/a/b2) was formed. The thickness of each layer was adjusted by controlling a gear pump in the manufacturing line and regulating the amount of discharge consequently, and the polymer flow passing through the junction block was controlled so that the total laminate thickness ratio of the surface part relative to the whole thickness of the final film after biaxial stretch and heat treatment was set to be 20%. After the molten polymers were formed into 3-layer laminate and were discharged from a T-die being set at 290° C., the polymers were solidified and cooled by bringing into contact with a cooling drum with a surface temperature of 25° C. by electrostatic application, and a cast sheet was obtained as a result. The sheet was stretched at an area stretching ratio of 3.8 times in the longitudinal direction at 110° C. and was stretched at an area stretching ratio of 4.0 times in the transverse direction at 115° C. By performing heat treatment for 8 seconds at 210° C. subsequently, an electrical insulation sheet having a thickness of 30 μm was obtained. Evaluation of the obtained sheet was carried out, and the result is shown in Tables 6 and 15. It is understood that this sheet has high characteristics as in the case of Example 5.

Example 28

The procedure of Example 1 of producing an electrical insulation sheet was repeated with some modifications: the polyester film used for a layer was changed as in Example 23; and an aramid fiber sheet ("Nomex", supplied by Teijin advance film Inc.) having a thickness of 50 μM was used for b1 layer and b2 layer. Evaluation of characteristics of the obtained sheet was carried out, and the evaluation result is shown in Tables 6 and 15. It is understood that this sheet has high characteristics as in the case of Example 5.

Example 29

The procedure of Example 23 of producing an electrical insulation sheet was repeated with some modifications: the polyester film used for a layer was changed as in Example 23; an aramid fiber sheet ("Nomex", supplied by Teijin advanced film Co., Ltd.) having a thickness of 50 μm was used for b1 layer; and "TORELINA" having a thickness of 25 μm was used for b2 layer. The evaluation of characteristics of the obtained sheet was carried out, and the evaluation result is shown in Tables 6 and 15. As in the case of Example 23, it is understood that this sheet has high characteristics as well.

Examples 51 and 52

80 parts by mass of Polyester composition of Example 5 and 20 parts by mass of titanium dioxide having an average particle size of 200 nm were put in a ventilated extruder and melt kneaded therein, and a polyester composition containing titanium dioxide was obtained as a result. By blending this polyester composition containing titanium dioxide and the polyester composition of Example 5 so that the amount of pigment content contained in P' layer was adjusted to the description in Tables, biaxial oriented films comprising layer P' were obtained. Furthermore, by using these films, electrical insulation sheets and solar battery back sheets were obtained in the same manner as in Example 1. The results are shown in Tables 10 and 19.

Examples 53 and 54

80 parts by mass of Polyester composition of Example 5 and 20 parts by mass of carbon black having an primary average particle size of 40 nm were put in a ventilated extruder and melt kneaded therein, and a polyester composition containing carbon black was obtained as a result. By blending this polyester composition containing carbon black and the polyester composition of Example 5 so that the amount of pigment content contained in P' layer was adjusted to the description in Tables, biaxial oriented films comprising layer P' were obtained. Furthermore, by using these films, electrical insulation sheets and solar battery back sheets were obtained in the same manner as in Example 1. The results are shown in Tables 10 and 19.

Comparative Examples 1-18

Polyester compositions were produced in a manner similar to Example 1 except that the composition of polyester compositions were changed in accordance with the specifications described in Tables. The glass transition temperature of the obtained polyethylene terephthalate is shown in Tables 4, 20 and 21. Furthermore, biaxially oriented films and electrical insulation sheets were obtained in the same manner as in Example 1. Furthermore, solar battery back sheets were obtained in the same manner as in Example 1. The evaluation of characteristics of the obtained sheets was carried out, and the evaluation result is shown in Tables 22-24. Although these sheets have good heat resistance and machinability, it is understood that these sheets are inferior in moist heat resistance of mechanical properties and moist heat resistance of electrical properties in comparison with Examples 1-54.

TABLE 1

| | | | Example 1 | Example 2 | Example 3 | Example 4 | Example 5 | Example 6 |
|---|---|---|---|---|---|---|---|---|
| | Polyester composition | | | | | | | |
| Polyester | Dicarboxylic acid ingredients | kind | Terephthalic acid | Terephthalic acid | Terephthalic acid | Terephthalic acid | Terephthalic acid | Terephthalic acid |
| | | amount (mol %) | 100 | 100 | 100 | 100 | 100 | 100 |
| | Diol ingredients | kind | Ethylene glycol | Ethylene glycol | Ethylene glycol | Ethylene glycol | Ethylene glycol | Ethylene glycol |
| | | amount (mol %) | 100 | 100 | 100 | 100 | 100 | 100 |
| | Ingredients having at least 3 carboxylic acid groups, and Ingredients having at least least 3 hydroxy groups | kind | — | — | — | — | — | — |
| | | amount relative to the whole ingredients (mol %) | — | — | 255 | — | — | — |
| | Alkali metal phosphate | kind | Sodium dihydrogen phosphate | Sodium dihydrogen phosphate | Sodium dihydrogen phosphate | Sodium dihydrogen phosphate | Sodium dihydrogen phosphate | Sodium dihydrogen phosphate |
| | | kind of alkali metal element | Na | Na | Na | Na | Na | Na |
| | | amount of alkali metal element (mol/t) | 1.30 | 1.30 | 3.00 | 1.70 | 1.70 | 1.20 |
| | Phosphorus acid | amount of phosphorus acid (mol/t) | 0.52 | 0.52 | 2.00 | 1.90 | 1.90 | 0.60 |
| | Phosphorus acid/Alkali metal phosphate | | 0.40 | 0.40 | 0.67 | 1.12 | 1.12 | 0.50 |
| | Amount of phosphorus (mol/t) | | 1.82 | 1.82 | 5.00 | 3.60 | 3.60 | 1.80 |
| | divalent metal element | kind | Mn | Mn | Mn | Mn | Mn | Mn |
| | | amount of metal element (mol/t) | 1.35 | 4.81 | 4.00 | 3.11 | 3.83 | 1.74 |
| | Mn/Ca | amount of Mn (mol/t) | 1.35 | 4.81 | 4.00 | 3.11 | 3.63 | 1.74 |
| | | amount of Ca (mol/t) | 0.00 | 0.00 | 0.00 | 0.00 | 0.00 | 0.00 |
| | Other than Mn/Ca | kind | — | — | — | — | — | — |
| | | amount (mol/t) | — | — | — | — | — | — |
| | M | | 2.00 | 5.46 | 5.50 | 3.96 | 4.68 | 2.34 |
| | M/P | | 1.10 | 3.00 | 1.10 | 1.10 | 1.30 | 1.30 |

TABLE 1-continued

|  |  | Example 1 | Example 2 | Example 3 | Example 4 | Example 5 | Example 6 |
|---|---|---|---|---|---|---|---|
| Characteristics | Tg (° C.) | 82 | 82 | 82 | 82 | 82 | 82 |
|  | Tm (° C.) | 255 | 255 | 255 | 255 | 255 | 255 |
|  | IV | 0.85 | 0.85 | 0.85 | 0.85 | 0.85 | 0.85 |
|  | COOH (eq./t) | 10.2 | 10.5 | 10.0 | 10.0 | 9.0 | 9.0 |

TABLE 2

|  |  |  | Example 7 | Example 8 | Example 9 | Example 10 | Example 11 | Example 12 |
|---|---|---|---|---|---|---|---|---|
|  | Polyester composition |  |  |  |  |  |  |  |
| Polyester | Dicarboxylic acid ingredients | kind | Terephthalic acid | Terephthalic acid | Terephthalic acid | Terephthalic acid | Terephthalic acid | Terephthalic acid |
|  |  | amount (mol %) | 100 | 100 | 100 | 100 | 100 | 99.9 |
|  | Diol ingredients | kind | Ethylene glycol | Ethylene glycol | Ethylene glycol | Ethylene glycol | Ethylene glycol | Ethylene glycol |
|  |  | amount (mol %) | 100 | 100 | 100 | 100 | 100 | 100 |
|  | Ingredients having at least 3 carboxylic acid groups, and Ingredients having at least 3 hydroxy groups | kind | — | — | — | — | — | Trimellitic acid |
|  |  | amount relative to the whole ingredients (mol %) | — | — | — | — | — | 0.05 |
|  | Alkali metal phosphate | kind | Sodium dihydrogen phosphate | Sodium dihydrogen phosphate | Sodium dihydrogen phosphate | Sodium dihydrogen phosphate | Sodium dihydrogen phosphate | Sodium dihydrogen phosphate |
|  |  | kind of alkali metal element | Na | Na | Na | Na | Na | Na |
|  |  | amount of alkali metal element (mol/t) | 1.20 | 2.40 | 1.20 | 3.00 | 3.50 | 1.70 |
|  | Phosphorus acid | amount of phosphorus acid (mol/t) | 1.80 | 1.20 | 1.80 | 2.00 | 1.50 | 1.90 |
|  | Phosphorus acid/Alkali metal phosphate |  | 1.50 | 0.50 | 1.50 | 0.67 | 0.43 | 1.12 |
|  | Amount of phosphorus (mol/t) |  | 3.00 | 3.60 | 3.00 | 5.00 | 5.00 | 3.60 |
|  | divalent metal element | kind | Mn | Mn | Mn | Mn | Mn | Mn |
|  |  | amount of metal element (mol/t) | 2.70 | 2.76 | 8.40 | 5.00 | 13.25 | 3.83 |
|  | Mn/Ca | amount of Mn (mol/t) | 2.70 | 2.76 | 8.40 | 5.00 | 13.25 | 3.83 |
|  |  | amount of Ca (mol/t) | 0.00 | 0.00 | 0.00 | 0.00 | 0.00 | 0.00 |
|  | Other than Mn/Ca | kind | — | — | — | — | — | — |
|  |  | amount (mol/t) | — | — | — | — | — | — |
|  | M |  | 3.30 | 3.96 | 9.00 | 6.50 | 15.00 | 4.68 |
|  | M/P |  | 1.10 | 1.10 | 3.00 | 1.30 | 3.00 | 1.30 |
| Characteristics | Tg (° C.) |  | 82 | 82 | 82 | 82 | 82 | 82 |
|  | Tm (° C.) |  | 255 | 255 | 255 | 255 | 255 | 255 |
|  | IV |  | 0.85 | 0.85 | 0.85 | 0.85 | 0.85 | 0.84 |
|  | COOH (eq./t) |  | 10.2 | 10.2 | 10.0 | 9.0 | 10.0 | 9.0 |

TABLE 3

|  |  |  | Example 19 | Example 20 | Example 21 | Example 22 | Example 23 | Example 24 |
|---|---|---|---|---|---|---|---|---|
|  | Polyester composition |  |  |  |  |  |  |  |
| Polyester | Dicarboxylic acid ingredients | kind | Terephthalic acid | Terephthalic acid | Terephthalic acid | Terephthalic acid | Terephthalic acid | Terephthalic acid |
|  |  | amount (mol %) | 99.95 | 99.9 | 100 | 100 | 100 | 100 |
|  | Diol ingredients | kind | Ethylene glycol | Ethylene glycol | Ethylene glycol | Ethylene glycol | Ethylene glycol | Ethylene glycol |
|  |  | amount (mol %) | 100 | 100 | 100 | 100 | 100 | 100 |
|  | Ingredients having at least 3 carboxylic acid groups, and Ingredients having at least 3 hydroxy groups | kind | Trimellitic acid | Trimellitic acid | — | — | — | — |
|  |  | amount relative to the whole ingredients (mol %) | 0.025 | 0.05 | — | — | — | — |
|  | Alkali metal phosphate | kind | Sodium dihydrogen phosphate | Sodium dihydrogen phosphate | Potassium dihydrogen phosphate | Trisodium phosphate | Sodium dihydrogen phosphate | Sodium dihydrogen phosphate |

TABLE 3-continued

|  |  | Example 19 | Example 20 | Example 21 | Example 22 | Example 23 | Example 24 |
|---|---|---|---|---|---|---|---|
|  | kind of alkali metal element | Na | Na | K | Na | Na | Na |
|  | amount of alkali metal element (mol/t) | 1.70 | 1.70 | 1.70 | 5.10 | 1.70 | 1.70 |
| Phosphorus acid | amount of phosphorus acid (mol/t) | 1.90 | 1.90 | 1.90 | 1.90 | 1.90 | 1.90 |
| Phosphorus acid/Alkali metal phosphate |  | 1.12 | 1.12 | 1.12 | 0.37 | 1.12 | 1.12 |
| Amount of phosphorus (mol/t) |  | 3.60 | 3.60 | 3.60 | 3.60 | 3.60 | 3.60 |
| divalent metal element | kind | Ca | Ca | Mn | Mn | Mn | Mn |
|  | amount of metal element (mol/t) | 3.83 | 3.83 | 3.83 | 2.13 | 3.83 | 3.83 |
| Mn/Ca | amount of Mn (mol/t) | 0.00 | 0.00 | 3.83 | 2.13 | 3.83 | 3.83 |
|  | amount of Ca (mol/t) | 3.83 | 3.83 | 0.00 | 0.00 | 0.00 | 0.00 |
| Other than Mn/Ca | kind | — | — | — | — | — | — |
|  | amount (mol/t) | — | — | — | — | — | — |
|  | M | 4.68 | 4.68 | 4.68 | 4.68 | 4.68 | 4.68 |
|  | M/P | 1.30 | 1.30 | 1.30 | 1.30 | 1.30 | 1.30 |
| Characteristics | Tg (° C.) | 82 | 82 | 82 | 82 | 82 | 82 |
|  | Tm (° C.) | 255 | 255 | 255 | 255 | 255 | 255 |
|  | IV | 0.84 | 0.84 | 0.85 | 0.85 | 0.85 | 0.85 |
|  | COOH (eq./t) | 9.0 | 9.0 | 9.0 | 9.0 | 9.0 | 9.0 |

TABLE 4

|  |  |  | Comparative Example 1 | Comparative Example 2 | Comparative Example 3 | Comparative Example 4 | Comparative Example 5 | Comparative Example 6 |
|---|---|---|---|---|---|---|---|---|
|  | Polyester composition |  |  |  |  |  |  |  |
| Polyester | Dicarboxylic acid ingredients | kind | Terephthalic acid | Terephthalic acid | Terephthalic acid | Terephthalic acid | Terephthalic acid | Terephthalic acid |
|  |  | amount (mol %) | 100 | 100 | 100 | 100 | 100 | 100 |
|  | Diol ingredients | kind | Ethylene glycol | Ethylene glycol | Ethylene glycol | Ethylene glycol | Ethylene glycol | Ethylene glycol |
|  |  | amount (mol %) | 100 | 100 | 100 | 100 | 100 | 100 |
|  | Ingredients having at least 3 carboxylic acid groups, and Ingredients having at least least 3 hydroxy groups | kind | — | — | — | — | — | — |
|  |  | amount relative to the whole ingredients (mol %) | — | 0 | — | — | — | — |
|  | Alkali metal phosphate | kind | Sodium dihydrogen phosphate | Sodium dihydrogen phosphate | Sodium dihydrogen phosphate | Sodium dihydrogen phosphate | Sodium dihydrogen phosphate | Sodium dihydrogen phosphate |
|  |  | kind of alkali metal element | Na | Na | Na | Na | Na | Na |
|  |  | amount of alkali metal element (mol/t) | 1.70 | 1.70 | 1.30 | 1.70 | 3.50 | 1.30 |
| Phosphorus acid |  | amount of phosphorus acid (mol/t) | 1.90 | 1.90 | 0.52 | 1.90 | 1.50 | 0.52 |
| Phosphorus acid/Alkali metal phosphate |  |  | 1.12 | 1.12 | 0.40 | 1.12 | 0.43 | 0.40 |
| Amount of phosphorus (mol/t) |  |  | 3.60 | 3.60 | 1.82 | 3.60 | 5.00 | 1.82 |
| divalent metal element |  | kind | Mg | Co | Mn | Mn | Mn | Mn |
|  |  | amount of metal element (mol/t) | 3.83 | 3.83 | 1.17 | 2.75 | 3.25 | 4.99 |
| Mn/Ca |  | amount of Mn (mol/t) | — | — | 1.17 | 2.75 | 3.25 | 4.99 |
|  |  | amount of Ca (mol/t) | — | — | 0.00 | 0.00 | 0.00 | 0.00 |
| Other than Mn/Ca |  | kind | Mg | Co | — | — | — | — |
|  |  | amount (mol/t) | 3.83 | 3.83 | — | — | — | — |
|  |  | M | 0.85 | 0.85 | 1.82 | 3.60 | 5.00 | 5.64 |
|  |  | M/P | 0.24 | 0.24 | 1.00 | 1.00 | 1.00 | 3.10 |
| Characteristics |  | Tg (° C.) | 82 | 82 | 82 | 82 | 82 | 82 |
|  |  | Tm (° C.) | 255 | 255 | 255 | 255 | 255 | 255 |
|  |  | IV | 0.85 | 0.85 | 0.85 | 0.85 | 0.85 | 0.85 |
|  |  | COOH (eq./t) | 14.0 | 14.0 | 14.0 | 14.0 | 14.0 | 14.0 |

TABLE 5

| | | Example 13 | Example 14 | Example 15 | Example 16 | Example 17 | Example 18 |
|---|---|---|---|---|---|---|---|
| Polyester composition | | | | | | | |
| Polyester Dicarboxylic acid ingredients | kind | Terephthalic acid | Terephthalic acid | Terephthalic acid | Terephthalic acid | Terephthalic acid | Terephthalic acid |
| | amount (mol %) | 99.95 | 99.9 | 99.7 | 100 | 100 | 100 |
| Diol ingredients | kind | Ethylene glycol | Ethylene glycol | Ethylene glycol | Ethylene glycol | Ethylene glycol | Ethylene glycol |
| | amount (mol %) | 100 | 100 | 100 | 99.9 | 100 | 100 |
| Ingredients having at least 3 carboxylic acid groups, and Ingredients having at least least 3 hydroxy groups | kind | Trimellitic acid | Trimellitic acid | Trimellitic acid | glycerine | — | — |
| | amount relative to the whole ingredients (mol %) | 0.025 | 0.05 | 1.5 | 0.05 | — | — |
| Alkali metal phosphate | kind | Sodium dihydrogen phosphate | Sodium dihydrogen phosphate | Sodium dihydrogen phosphate | Sodium dihydrogen phosphate | Sodium dihydrogen phosphate | Sodium dihydrogen phosphate |
| | kind of alkali metal element | Na | Na | Na | Na | Na | Na |
| | amount of alkali metal element (mol/t) | 1.70 | 1.70 | 1.70 | 1.70 | 1.70 | 1.70 |
| Phosphorus acid | amount of phosphorus acid (mol/t) | 1.90 | 1.90 | 1.90 | 1.90 | 1.90 | 1.90 |
| Phosphorus acid/Alkali metal phosphate | | 1.12 | 1.12 | 1.12 | 1.12 | 1.12 | 1.12 |
| Amount of phosphorus (mol/t) | | 3.60 | 3.60 | 3.60 | 3.60 | 3.60 | 3.60 |
| divalent metal element | kind | Mn | Mn | Mn | Mn | Ca | Ca |
| | amount of metal element (mol/t) | 3.83 | 3.83 | 3.83 | 3.83 | 3.83 | 3.83 |
| Mn/Ca | amount of Mn (mol/t) | 3.83 | 3.83 | 3.83 | 3.83 | 0.00 | 0.00 |
| | amount of Ca (mol/t) | 0.00 | 0.00 | 0.00 | 0.00 | 3.83 | 3.83 |
| Other than Mn/Ca | kind | — | — | — | — | — | — |
| | amount (mol/t) | — | — | — | — | — | — |
| | M | 4.68 | 4.68 | 4.68 | 4.68 | 4.68 | 4.68 |
| | M/P | 1.30 | 1.30 | 1.30 | 1.30 | 1.30 | 1.30 |
| Characteristics | Tg (° C.) | 82 | 82 | 82 | 82 | 82 | 82 |
| | Tm (° C.) | 255 | 255 | 255 | 255 | 255 | 255 |
| | IV | 0.84 | 0.83 | 0.82 | 0.84 | 0.85 | 0.85 |
| | COOH (eq./t) | 9.0 | 9.0 | 9.0 | 9.0 | 9.0 | 9.0 |

TABLE 6

| | | Example 25 | Example 26 | Example 27 | Example 28 | Example 29 | Example 30 |
|---|---|---|---|---|---|---|---|
| Polyester composition | | | | | | | |
| Polyester Dicarboxylic acid ingredients | kind | Terephthalic acid | 2,6-Naphthalene dicarboxylic acid | Terephthalic acid | Terephthalic acid | Terephthalic acid | Terephthalic acid |
| | amount (mol %) | 100 | 100 | 100 | 100 | 100 | 100 |
| Diol ingredients | kind | Ethylene glycol | Ethylene glycol | Ethylene glycol | Ethylene glycol | Ethylene glycol | Ethylene glycol |
| | amount (mol %) | 100 | 100 | 100 | 100 | 100 | 100 |
| Ingredients having at least 3 carboxylic acid groups, and Ingredients having at least least 3 hydroxy groups | kind | — | — | — | — | — | — |
| | amount relative to the whole ingredients (mol %) | — | — | — | — | — | — |
| Alkali metal phosphate | kind | Sodium dihydrogen phosphate | Sodium dihydrogen phosphate | Sodium dihydrogen phosphate | Sodium dihydrogen phosphate | Sodium dihydrogen phosphate | Sodium dihydrogen phosphate |
| | kind of alkali metal element | Na | Na | Na | Na | Na | Na |
| | amount of alkali metal element (mol/t) | 1.70 | 1.70 | 1.70 | 1.70 | 1.70 | 1.30 |

TABLE 6-continued

|  |  | Example 25 | Example 26 | Example 27 | Example 28 | Example 29 | Example 30 |
|---|---|---|---|---|---|---|---|
| Phosphorus acid | amount of phosphorus acid (mol/t) | 1.90 | 1.90 | 1.90 | 1.90 | 1.90 | 0.52 |
| Phosphorus acid/Alkali metal phosphate |  | 1.12 | 1.12 | 1.12 | 1.12 | 1.12 | 0.40 |
| Amount of phosphorus (mol/t) |  | 3.60 | 3.60 | 3.60 | 3.60 | 3.60 | 1.82 |
| divalent metal element | kind | Mn | Mn | Mn | Mn | Mn | Mn |
|  | amount of metal element (mol/t) | 3.83 | 3.83 | 3.83 | 3.83 | 3.83 | 1.44 |
| Mn/Ca | amount of Mn (mol/t) | 3.83 | 3.83 | 3.83 | 3.83 | 3.83 | 1.44 |
|  | amount of Ca (mol/t) | 0.00 | 0.00 | 0.00 | 0.00 | 0.00 | 0.00 |
| Other than Mn/Ca | kind | — | — | — | — | — | — |
|  | amount (mol/t) | — | — | — | — | — | — |
| M |  | 4.68 | 4.68 | 4.68 | 4.68 | 4.68 | 2.09 |
| M/P |  | 1.30 | 1.30 | 1.30 | 1.30 | 1.30 | 1.15 |
| Characteristics | Tg (° C.) | 82 | 123 | 82 | 82 | 82 | 82 |
|  | Tm (° C.) | 255 | 265 | 255 | 255 | 255 | 255 |
|  | IV | 0.85 | 0.90 | 0.85 | 0.85 | 0.85 | 0.85 |
|  | COOH (eq./t) | 9.0 | 10.0 | 9.0 | 9.0 | 9.0 | 9.5 |

TABLE 7

|  |  |  | Example 31 | Example 32 | Example 33 | Example 34 | Example 35 | Example 36 |
|---|---|---|---|---|---|---|---|---|
| Polyester composition |  |  |  |  |  |  |  |  |
| Polyester | Dicarboxylic acid ingredients | kind | Terephthalic acid | Terephthalic acid | Terephthalic acid | Terephthalic acid | Terephthalic acid | Terephthalic acid |
|  |  | amount (mol %) | 100 | 100 | 100 | 100 | 100 | 100 |
|  | Diol ingredients | kind | Ethylene glycol | Ethylene glycol | Ethylene glycol | Ethylene glycol | Ethylene glycol | Ethylene glycol |
|  |  | amount (mol %) | 100 | 100 | 100 | 100 | 100 | 100 |
|  | Ingredients having at least 3 carboxylic acid groups, and Ingredients having at least least 3 hydroxy groups | kind | — | — | — | — | — | — |
|  |  | amount relative to the whole ingredients (mol %) | — | — | — | — | — | — |
| Alkali metal phosphate | kind |  | Sodium dihydrogen phosphate | Sodium dihydrogen phosphate | Sodium dihydrogen phosphate | Sodium dihydrogen phosphate | Sodium dihydrogen phosphate | Sodium dihydrogen phosphate |
|  | kind of alkali metal element |  | Na | Na | Na | Na | Na | Na |
|  | amount of alkali metal element (mol/t) |  | 1.30 | 3.50 | 3.50 | 1.30 | 1.30 | 3.50 |
| Phosphorus acid | amount of phosphorus acid (mol/t) |  | 0.52 | 1.50 | 1.50 | 0.52 | 0.52 | 1.50 |
| Phosphorus acid/Alkali metal phosphate |  |  | 0.40 | 0.43 | 0.43 | 0.40 | 0.40 | 0.43 |
| Amount of phosphorus (mol/t) |  |  | 1.82 | 5.00 | 5.00 | 1.82 | 1.82 | 5.00 |
| divalent metal element | kind |  | Mn | Mn | Mn | Ca | Ca | Ca |
|  | amount of metal element (mol/t) |  | 1.90 | 4.00 | 5.25 | 1.44 | 1.90 | 4.00 |
| Mn/Ca | amount of Mn (mol/t) |  | 1.90 | 4.00 | 5.25 | 0.00 | 0.00 | 0.00 |
|  | amount of Ca (mol/t) |  | 0.00 | 0.00 | 0.00 | 1.44 | 1.90 | 4.00 |
| Other than Mn/Ca | kind |  | — | — | — | — | — | — |
|  | amount (mol/t) |  | — | — | — | — | — | — |
| M |  |  | 2.55 | 5.75 | 7.00 | 2.09 | 2.55 | 5.75 |
| M/P |  |  | 1.40 | 1.15 | 1.40 | 1.15 | 1.40 | 1.15 |
| Characteristics | Tg (° C.) |  | 82 | 82 | 82 | 82 | 82 | 82 |
|  | Tm (° C.) |  | 255 | 255 | 255 | 255 | 255 | 255 |
|  | IV |  | 0.85 | 0.85 | 0.85 | 0.85 | 0.85 | 0.85 |
|  | COOH (eq./t) |  | 9.5 | 9.5 | 9.5 | 9.5 | 9.5 | 9.5 |

TABLE 8

|  |  |  | Example 37 | Example 38 | Example 39 | Example 40 | Example 41 | Example 42 |
|---|---|---|---|---|---|---|---|---|
| Polyester composition | | | | | | | | |
| Polyester | Dicarboxylic acid ingredients | kind | Terephthalic acid | Terephthalic acid | Terephthalic acid | Terephthalic acid | Terephthalic acid | Terephthalic acid |
| | | amount (mol %) | 100 | 100 | 100 | 100 | 100 | 100 |
| | Diol ingredients | kind | Ethylene glycol | Ethylene glycol | Ethylene glycol | Ethylene glycol | Ethylene glycol | Ethylene glycol |
| | | amount (mol %) | 100 | 100 | 100 | 100 | 100 | 100 |
| | Ingredients having at least 3 carboxylic acid groups, and Ingredients having at least 3 hydroxy groups | kind | — | — | — | — | — | — |
| | | amount relative to the whole ingredients (mol %) | — | — | — | — | — | — |
| | Alkali metal phosphate | kind | Sodium dihydrogen phosphate | Sodium dihydrogen phosphate | Sodium dihydrogen phosphate | Sodium dihydrogen phosphate | Sodium dihydrogen phosphate | Potassium dihydrogen phosphate |
| | | kind of alkali metal element | Na | Na | Na | Na | Na | K |
| | | amount of alkali metal element (mol/t) | 3.50 | 1.30 | 1.30 | 3.50 | 3.50 | 1.30 |
| | Phosphorus acid | amount of phosphorus acid (mol/t) | 1.50 | 0.52 | 0.52 | 1.50 | 1.50 | 0.52 |
| | Phosphorus acid/Alkali metal phosphate | | 0.43 | 0.40 | 0.40 | 0.43 | 0.43 | 0.40 |
| | Amount of phosphorus (mol/t) | | 5.00 | 1.82 | 1.82 | 5.00 | 5.00 | 1.82 |
| | divalent metal element | kind | Ca | Mn, Ca | Mn, Ca | Mn, Ca | Mn, Ca | Mn |
| | | amount of metal element (mol/t) | 5.25 | 1.44 | 1.90 | 4.00 | 5.25 | 1.44 |
| | Mn/Ca | amount of Mn (mol/t) | 0.00 | 0.72 | 0.95 | 2.00 | 3.00 | 1.44 |
| | | amount of Ca (mol/t) | 5.25 | 0.72 | 0.95 | 2.00 | 2.25 | 0.00 |
| | Other than Mn/Ca | kind | — | — | — | — | — | — |
| | | amount (mol/t) | — | — | — | — | — | — |
| | M | | 7.00 | 2.09 | 2.55 | 5.75 | 7.00 | 2.09 |
| | M/P | | 1.40 | 1.15 | 1.40 | 1.15 | 1.40 | 1.15 |
| | Characteristics | Tg (° C.) | 82 | 82 | 82 | 82 | 82 | 82 |
| | | Tm (° C.) | 255 | 255 | 255 | 255 | 255 | 255 |
| | | IV | 0.85 | 0.85 | 0.85 | 0.85 | 0.85 | 0.85 |
| | | COOH (eq./t) | 9.5 | 9.5 | 9.5 | 9.5 | 9.5 | 9.5 |

TABLE 9

|  |  |  | Example 43 | Example 44 | Example 45 | Example 46 | Example 47 | Example 48 |
|---|---|---|---|---|---|---|---|---|
| Polyester composition | | | | | | | | |
| Polyester | Dicarboxylic acid ingredients | kind | Terephthalic acid | Terephthalic acid | Terephthalic acid | Terephthalic acid | Terephthalic acid | Terephthalic acid |
| | | amount (mol %) | 100 | 100 | 100 | 99.68 | 100 | 100 |
| | Diol ingredients | kind | Ethylene glycol | Ethylene glycol | Ethylene glycol | Ethylene glycol | Ethylene glycol | Ethylene glycol |
| | | amount (mol %) | 100 | 100 | 100 | 100 | 100 | 100 |
| | Ingredients having at least 3 carboxylic acid groups, and Ingredients having at least 3 hydroxy groups | kind | — | — | — | Trimellitic acid | — | — |
| | | amount relative to the whole ingredients (mol %) | — | — | — | 1.6 | — | — |
| | Alkali metal phosphate | kind | Potassium dihydrogen phosphate | Potassium dihydrogen phosphate | Potassium dihydrogen phosphate | Sodium dihydrogen phosphate | Sodium dihydrogen phosphate | Sodium dihydrogen phosphate |
| | | kind of alkali metal element | K | K | K | Na | Na | Na |
| | | amount of alkali metal element (mol/t) | 1.30 | 3.50 | 3.50 | 1.70 | 1.70 | 1.70 |
| | Phosphorus acid | amount of phosphorus acid (mol/t) | 0.52 | 1.50 | 1.50 | 1.90 | 0.12 | 0.12 |
| | Phosphorus acid/Alkali metal phosphate | | 0.40 | 0.43 | 0.43 | 1.12 | 0.07 | 0.07 |
| | Amount of phosphorus (mol/t) | | 1.82 | 5.00 | 5.00 | 3.60 | 1.82 | 1.82 |
| | divalent metal element | kind | Mn | Mn | Mn | Mn | Mn | Mn |
| | | amount of metal element (mol/t) | 1.90 | 4.00 | 5.25 | 3.83 | 1.15 | 4.61 |

TABLE 9-continued

|  |  | Example 43 | Example 44 | Example 45 | Example 46 | Example 47 | Example 48 |
|---|---|---|---|---|---|---|---|
| Mn/Ca | amount of Mn (mol/t) | 1.90 | 4.00 | 5.25 | 3.83 | 1.15 | 4.61 |
|  | amount of Ca (mol/t) | 0.00 | 0.00 | 0.00 | 0.00 | 0.00 | 0.00 |
| Other than Mn/Ca | kind | — | — | — | — | — | — |
|  | amount (mol/t) | — | — | — | — | — | — |
|  | M | 2.55 | 5.75 | 7.00 | 4.68 | 2.00 | 5.46 |
|  | M/P | 1.40 | 1.15 | 1.40 | 1.30 | 1.10 | 3.00 |
| Characteristics | Tg (° C.) | 82 | 82 | 82 | 82 | 82 | 82 |
|  | Tm (° C.) | 255 | 255 | 255 | 255 | 255 | 255 |
|  | IV | 0.85 | 0.85 | 0.85 | 0.81 | 0.85 | 0.85 |
|  | COOH (eq./t) | 9.5 | 9.5 | 9.5 | 10.0 | 11.0 | 11.0 |

TABLE 10

|  |  |  |  | Example 49 | Example 50 | Example 51 | Example 52 | Example 53 | Example 54 |
|---|---|---|---|---|---|---|---|---|---|
| Polyester composition | Polyester | Dicarboxylic acid ingredients | kind | Terephthalic acid | Terephthalic acid | Terephthalic acid | Terephthalic acid | Terephthalic acid | Terephthalic acid |
|  |  |  | amount (mol %) | 100 | 100 | 100 | 100 | 100 | 100 |
|  |  | Diol ingredients | kind | Ethylene glycol | Ethylene glycol | Ethylene glycol | Ethylene glycol | Ethylene glycol | Ethylene glycol |
|  |  |  | amount (mol %) | 100 | 100 | 100 | 100 | 100 | 100 |
|  |  | Ingredients having at least 3 carboxylic acid groups, and Ingredients having at least 3 hydroxy groups | kind | — | — | — | — | — | — |
|  |  |  | amount relative to the whole ingredients (mol %) | — | — | — | — | — | — |
|  | Alkali metal phosphate |  | kind | Sodium dihydrogen phosphate | Sodium dihydrogen phosphate | Sodium dihydrogen phosphate | Sodium dihydrogen phosphate | Sodium dihydrogen phosphate | Sodium dihydrogen phosphate |
|  |  |  | kind of alkali metal element | Na | Na | Na | Na | Na | Na |
|  |  |  | amount of alkali metal element (mol/t) | 1.70 | 1.70 | 1.70 | 1.70 | 1.70 | 1.70 |
|  | Phosphorus acid |  | amount of phosphorus acid (mol/t) | 3.30 | 3.30 | 1.90 | 1.90 | 1.90 | 1.90 |
|  | Phosphorus acid/Alkali metal phosphate |  |  | 1.94 | 1.94 | 1.12 | 1.12 | 1.12 | 1.12 |
|  | Amount of phosphorus (mol/t) |  |  | 5.00 | 5.00 | 3.60 | 3.60 | 3.60 | 3.60 |
|  | divalent metal element |  | kind | Mn | Mn | Mn | Mn | Mn | Mn |
|  |  |  | amount of metal element (mol/t) | 4.65 | 14.15 | 3.83 | 3.83 | 3.83 | 3.83 |
|  | Mn/Ca |  | amount of Mn (mol/t) | 4.65 | 14.15 | 3.83 | 3.83 | 3.83 | 3.83 |
|  |  |  | amount of Ca (mol/t) | 0.00 | 0.00 | 0.00 | 0.00 | 0.00 | 0.00 |
|  | Other than Mn/Ca |  | kind | — | — | — | — | — | — |
|  |  |  | amount (mol/t) | — | — | — | — | — | — |
|  |  | M |  | 5.50 | 15.00 | 4.68 | 4.68 | 4.68 | 4.68 |
|  |  | M/P |  | 1.10 | 3.00 | 1.30 | 1.30 | 1.30 | 1.30 |
| Characteristics |  | Tg (° C.) |  | 82 | 82 | 82 | 82 | 82 | 82 |
|  |  | Tm (° C.) |  | 255 | 255 | 255 | 255 | 255 | 255 |
|  |  | IV |  | 0.85 | 0.85 | 0.85 | 0.85 | 0.85 | 0.85 |
|  |  | COOH (eq./t) |  | 11.0 | 11.0 | 9.0 | 9.0 | 9.0 | 9.0 |

TABLE 11

|  |  |  | Example 1 | Example 2 | Example 3 | Example 4 | Example 5 | Example 6 |
|---|---|---|---|---|---|---|---|---|
| Layer P or layer P' | Ratio of polyester composition with respect to layer P or layer P' (%) | | 100 | 100 | 100 | 100 | 100 | 100 |
| | kind of pigment in layer P or layer P' | | — | — | — | — | — | — |
| | ratio of pigment with respect to layer P or layer P' | | 0.0 | 0.0 | 0.0 | 0.0 | 0.0 | 0.0 |
| Film (layer a) | Ratio of polyester composition with respect to the whole layer a (wt %) | | 100 | 100 | 100 | 100 | 100 | 100 |
| | Conditions | Stretch temperature in longitudinal direction (° C.) | 90 | 90 | 90 | 90 | 90 | 90 |
| | | Stretch ratio in longitudinal direction (times) | 3.5 | 3.5 | 3.5 | 3.5 | 3.5 | 3.5 |
| | | Stretch temperature in transverse direction (° C.) | 100 | 100 | 100 | 100 | 100 | 100 |
| | | Stretch ratio in transverse direction (times) | 4.2 | 4.2 | 4.2 | 4.2 | 4.2 | 4.2 |
| | | Heat treatment temperature (° C.) | 200 | 200 | 200 | 200 | 200 | 200 |
| | | Thickness (μm) | 50 | 50 | 50 | 50 | 50 | 50 |
| | Physical properties | Planar orientation coefficient R | 5 | 5 | 5 | 5 | 5 | 5 |
| | | Moist heat resistance of mechanical properties | B | B | B | B | A | A |
| | | Half-life of elongation | 28 | 28 | 28 | 28 | 33 | 33 |
| Sheet-like structure | Structure | | b1/c/a/c/b2 | b1/c/a/c/b2 | b1/c/a/c/b2 | b1/c/a/c/b2 | b1/c/a/c/b2 | b1/c/a/c/b2 |
| | Layer b1 | kind | Biaxially oriented PPS | Biaxially oriented PPS | Biaxially oriented PPS | Biaxially oriented PPS | Biaxially oriented PPS | Biaxially oriented PPS |
| | | Thickness (μm) | 12 | 12 | 12 | 12 | 12 | 12 |
| | Layer b2 | kind | Biaxially oriented PPS | Biaxially oriented PPS | Biaxially oriented PPS | Biaxially oriented PPS | Biaxially oriented PPS | Biaxially oriented PPS |
| | | Thickness (μm) | 12 | 12 | 12 | 12 | 12 | 12 |
| | Laminate ratio ((B1 + B2)/A) | | 0.48 | 0.48 | 0.48 | 0.48 | 0.48 | 0.48 |
| | Total thickness (μm) | | 84 | 84 | 84 | 84 | 84 | 84 |
| | Performance | Processability | A | A | A | A | A | A |
| | | Moist heat resistance of mechanical properties | B | B | B | B | A | A |
| | | Half-life of elongation | 33 | 33 | 33 | 33 | 38 | 38 |
| | | Heat resistance | A | A | A | A | A | A |
| | | Half-life of elongation | 120 | 120 | 120 | 120 | 120 | 120 |
| | | Moist heat resistance of electrical properties | A | A | A | A | A | A |
| Solar cell back sheet | Moist heat resistance of mechanical properties | | B | B | B | B | A | A |

TABLE 12

|  |  |  | Example 7 | Example 8 | Example 9 | Example 10 | Example 11 | Example 12 |
|---|---|---|---|---|---|---|---|---|
| Layer P or layer P' | Ratio of polyester composition with respect to layer P or layer P' (%) | | 100 | 100 | 100 | 100 | 100 | 100 |
| | kind of pigment in layer P or layer P' | | — | — | — | — | — | — |
| | ratio of pigment with respect to layer P or layer P' | | 0.0 | 0.0 | 0.0 | 0.0 | 0.0 | 0.0 |
| Film (layer a) | Ratio of polyester composition with respect to the whole layer a (wt %) | | 100 | 100 | 100 | 100 | 100 | 100 |
| | Conditions | Stretch temperature in longitudinal direction (° C.) | 90 | 90 | 90 | 90 | 90 | 90 |
| | | Stretch ratio in longitudinal direction (times) | 3.5 | 3.5 | 3.5 | 3.5 | 3.5 | 3.5 |
| | | Stretch temperature in transverse direction (° C.) | 100 | 100 | 100 | 100 | 100 | 100 |
| | | Stretch ratio in transverse direction (times) | 4.2 | 4.2 | 4.2 | 4.2 | 4.2 | 4.2 |
| | | Heat treatment temperature (° C.) | 200 | 200 | 200 | 200 | 200 | 200 |
| | | Thickness (μm) | 50 | 50 | 50 | 50 | 50 | 50 |
| | Physical properties | Planar orientation coefficient R | 5 | 5 | 5 | 5 | 5 | 5 |
| | | Moist heat resistance of mechanical properties | B | B | B | A | B | S |
| | | Half-life of elongation | 28 | 28 | 26 | 33 | 28 | 35 |
| Sheet-like structure | Structure | | b1/c/a/c/b2 | b1/c/a/c/b2 | b1/c/a/c/b2 | b1/c/a/c/b2 | b1/c/a/c/b2 | b1/c/a/c/b2 |
| | Layer b1 | kind | Biaxially oriented PPS | Biaxially oriented PPS | Biaxially oriented PPS | Biaxially oriented PPS | Biaxially oriented PPS | Biaxially oriented PPS |

TABLE 12-continued

|  |  |  | Example 7 | Example 8 | Example 9 | Example 10 | Example 11 | Example 12 |
|---|---|---|---|---|---|---|---|---|
|  |  | Thickness (μm) | 12 | 12 | 12 | 12 | 12 | 12 |
|  | Layer b2 | kind | Biaxially oriented PPS | Biaxially oriented PPS | Biaxially oriented PPS | Biaxially oriented PPS | Biaxially oriented PPS | Biaxially oriented PPS |
|  |  | Thickness (μm) | 12 | 12 | 12 | 12 | 12 | 12 |
|  | Laminate ratio ((B1 + B2)/A) |  | 0.48 | 0.48 | 0.48 | 0.48 | 0.48 | 0.48 |
|  | Total thickness (μm) |  | 84 | 84 | 84 | 84 | 84 | 84 |
|  | Performance | Processability | A | A | A | A | A | A |
|  |  | Moist heat resistance of mechanical properties | B | B | B | A | B | S |
|  |  | Half-life of elongation | 33 | 33 | 31 | 38 | 33 | 40 |
|  |  | Heat resistance | A | A | A | A | A | A |
|  |  | Half-life of elongation | 120 | 120 | 120 | 120 | 120 | 120 |
|  |  | Moist heat resistance of electrical properties | A | A | A | A | A | A |
| Solar cell back sheet | Moist heat resistance of mechanical properties |  | B | B | B | A | B | S |

TABLE 13

|  |  |  | Example 13 | Example 14 | Example 15 | Example 16 | Example 17 | Example 18 |
|---|---|---|---|---|---|---|---|---|
| Layer P or layer P' | Ratio of polyester composition with respect to layer P or layer P' (%) |  | 100 | 100 | 100 | 100 | 100 | 100 |
|  | kind of pigment in layer P or layer P' |  | — | — | — | — | — | — |
|  | ratio of pigment with respect to layer P or layer P' |  | 0.0 | 0.0 | 0.0 | 0.0 | 0.0 | 0.0 |
| Film (layer a) | Ratio of polyester composition with respect to the whole layer a (wt %) |  | 100 | 100 | 100 | 100 | 100 | 100 |
|  | Conditions | Stretch temperature in longitudinal direction (° C.) | 90 | 90 | 90 | 90 | 90 | 90 |
|  |  | Stretch ratio in longitudinal direction (times) | 3.8 | 3.8 | 3.8 | 3.8 | 3.5 | 3.8 |
|  |  | Stretch temperature in transverse direction (° C.) | 100 | 100 | 100 | 100 | 100 | 100 |
|  |  | Stretch ratio in transverse direction (times) | 4.2 | 4.2 | 4.2 | 4.2 | 4.2 | 4.2 |
|  |  | Heat treatment temperature (° C.) | 200 | 200 | 200 | 200 | 200 | 200 |
|  |  | Thickness (μm) | 50 | 50 | 50 | 50 | 50 | 50 |
|  | Physical properties | Planar orientation coefficient R | 8 | 8 | 8 | 8 | 5 | 8 |
|  |  | Moist heat resistance of mechanical properties | S | S | S | S | A | A |
|  |  | Half-life of elongation | 35 | 35 | 35 | 35 | 33 | 33 |
| Sheet-like structure | Structure |  | b1/c/a/c/b2 | b1/c/a/c/b2 | b1/c/a/c/b2 | b1/c/a/c/b2 | b1/c/a/c/b2 | b1/c/a/c/b2 |
|  | Layer b1 | kind | Biaxially oriented PPS | Biaxially oriented PPS | Biaxially oriented PPS | Biaxially oriented PPS | Biaxially oriented PPS | Biaxially oriented PPS |
|  |  | Thickness (μm) | 12 | 12 | 12 | 12 | 12 | 12 |
|  | Layer b2 | kind | Biaxially oriented PPS | Biaxially oriented PPS | Biaxially oriented PPS | Biaxially oriented PPS | Biaxially oriented PPS | Biaxially oriented PPS |
|  |  | Thickness (μm) | 12 | 12 | 12 | 12 | 12 | 12 |
|  | Laminate ratio ((B1 + B2)/A) |  | 0.48 | 0.48 | 0.48 | 0.48 | 0.48 | 0.48 |
|  | Total thickness (μm) |  | 84 | 84 | 84 | 84 | 84 | 84 |
|  | Performance | Processability | A | A | A | A | A | A |
|  |  | Moist heat resistance of mechanical properties | S | S | S | S | A | A |
|  |  | Half-life of elongation | 40 | 40 | 40 | 40 | 38 | 38 |
|  |  | Heat resistance | A | A | A | A | A | A |
|  |  | Half-life of elongation | 120 | 120 | 120 | 120 | 120 | 120 |
|  |  | Moist heat resistance of electrical properties | A | A | A | A | A | A |
| Solar cell back sheet | Moist heat resistance of mechanical properties |  | S | S | S | S | A | A |

TABLE 14

| | | Example 19 | Example 20 | Example 21 | Example 22 | Example 23 | Example 24 |
|---|---|---|---|---|---|---|---|
| Layer P or layer P' | Ratio of polyester composition with respect to layer P or layer P' (%) | 100 | 100 | 100 | 100 | 100 | 100 |
| | kind of pigment in layer P or layer P' | — | — | — | — | — | — |
| | ratio of pigment with respect to layer P or layer P' | 0.0 | 0.0 | 0.0 | 0.0 | 0.0 | 0.0 |
| Film (layer a) | Ratio of polyester composition with respect to the whole layer a (wt %) | 100 | 100 | 100 | 100 | 100 | 100 |
| | Conditions Stretch temperature in longitudinal direction (° C.) | 90 | 90 | 90 | 90 | 90 | 90 |
| | Stretch ratio in longitudinal direction (times) | 3.8 | 3.8 | 3.5 | 3.5 | 3.5 | 3.5 |
| | Stretch temperature in transverse direction (° C.) | 100 | 100 | 100 | 100 | 100 | 100 |
| | Stretch ratio in transverse direction (times) | 4.2 | 4.2 | 4.2 | 4.2 | 4.2 | 4.2 |
| | Heat treatment temperature (° C.) | 200 | 200 | 200 | 200 | 200 | 200 |
| | Thickness (μm) | 50 | 50 | 50 | 50 | 125 | 188 |
| | Physical properties Planar orientation coefficient R | 8 | 8 | 5 | 5 | 5 | 5 |
| | Moist heat resistance of mechanical properties | A | A | A | A | A | A |
| | Half-life of elongation | 34 | 34 | 33 | 33 | 33 | 33 |
| Sheet-like structure | Structure | b1/c/a/c/b2 | b1/c/a/c/b2 | b1/c/a/c/b2 | b1/c/a/c/b2 | b1/c/a/c/b2 | b1/c/a/c/b2 |
| | Layer b1 kind | Biaxially oriented PPS | Biaxially oriented PPS | Biaxially oriented PPS | Biaxially oriented PPS | Biaxially oriented PPS | Biaxially oriented PPS |
| | Thickness (μm) | 12 | 12 | 12 | 12 | 16 | 25 |
| | Layer b2 kind | Biaxially oriented PPS | Biaxially oriented PPS | Biaxially oriented PPS | Biaxially oriented PPS | Biaxially oriented PPS | Biaxially oriented PPS |
| | Thickness (μm) | 12 | 12 | 12 | 12 | 16 | 25 |
| | Laminate ratio ((B1 + B2)/A) | 0.48 | 0.48 | 0.48 | 0.48 | 0.26 | 0.27 |
| | Total thickness (μm) | 84 | 84 | 84 | 84 | 167 | 248 |
| | Performance Processability | A | A | A | A | A | A |
| | Moist heat resistance of mechanical properties | A | A | A | A | A | A |
| | Half-life of elongation | 39 | 39 | 38 | 38 | 38 | 38 |
| | Heat resistance | A | A | A | A | A | A |
| | Half-life of elongation | 120 | 120 | 120 | 120 | 125 | 130 |
| | Moist heat resistance of electrical properties | A | A | A | A | A | A |
| Solar cell back sheet | Moist heat resistance of mechanical properties | A | A | A | A | A | A |

TABLE 15

| | | Example 25 | Example 26 | Example 27 | Example 28 | Example 29 | Example 30 |
|---|---|---|---|---|---|---|---|
| Layer P or layer P' | Ratio of polyester composition with respect to layer P or layer P' (%) | 100 | 100 | 85 | 100 | 100 | 100 |
| | kind of pigment in layer P or layer P' | — | — | — | — | — | — |
| | ratio of pigment with respect to layer P or layer P' | 0.0 | 0.0 | 0.0 | 0.0 | 0.0 | 0.0 |
| Film (layer a) | Ratio of polyester composition with respect to the whole layer a (wt %) | 100 | 100 | 85 | 100 | 100 | 100 |
| | Conditions Stretch temperature in longitudinal direction (° C.) | 90 | 135 | 110 | 90 | 90 | 90 |
| | Stretch ratio in longitudinal direction (times) | 3.5 | 3.5 | 3.8 | 3.5 | 3.5 | 3.5 |
| | Stretch temperature in transverse direction (° C.) | 100 | 140 | 115 | 100 | 100 | 100 |
| | Stretch ratio in transverse direction (times) | 4.2 | 4.2 | 4.0 | 4.2 | 4.2 | 4.2 |
| | Heat treatment temperature (° C.) | 200 | 230 | 210 | 200 | 200 | 200 |
| | Thickness (μm) | 250 | 50 | 24 | 125 | 125 | 50 |
| | Physical properties Planar orientation coefficient R | 5 | 5 | 5 | 5 | 5 | 5 |
| | Moist heat resistance of mechanical properties | A | A | A | A | A | A |
| | Half-life of elongation | 33 | 33 | 33 | 33 | 33 | 31 |
| Sheet-like structure | Structure | b1/c/a/c/b2 | b1/c/a/c/b2 | b1/c/a/c/b2 | b1/a/b2 | b1/c/a/c/b2 | b1/c/a/c/b2 |
| | Layer b1 kind | Biaxially oriented PPS | Biaxially oriented PPS | Biaxially oriented PPS | Aramid fiber sheet | Aramid fiber sheet | Biaxially oriented PPS |
| | Thickness (μm) | 25 | 12 | 3 | 50 | 50 | 12 |
| | Layer b2 kind | Biaxially oriented PPS | Biaxially oriented PPS | Biaxially oriented PPS | Aramid fiber sheet | Biaxially oriented PPS | Biaxially oriented PPS |

TABLE 15-continued

|  |  | Example 25 | Example 26 | Example 27 | Example 28 | Example 29 | Example 30 |
|---|---|---|---|---|---|---|---|
|  | Thickness (μm) | 25 | 12 | 3 | 50 | 25 | 12 |
|  | Laminate ratio ((B1 + B2)/A) | 0.20 | 0.48 | 0.25 | 0.80 | 0.60 | 0.48 |
|  | Total thickness (μm) | 310 | 84 | 30 | 235 | 210 | 84 |
| Performance | Processability | A | A | A | A | A | A |
|  | Moist heat resistance of mechanical properties | A | A | A | A | A | A |
|  | Half-life of elongation | 38 | 38 | 38 | 38 | 38 | 36 |
|  | Heat resistance | A | A | A | A | A | A |
|  | Half-life of elongation | 130 | 120 | 110 | 120 | 120 | 120 |
|  | Moist heat resistance of electrical properties | A | A | A | A | A | A |
| Solar cell back sheet | Moist heat resistance of mechanical properties | A | A | — | — | — | A |

TABLE 16

|  |  |  | Example 31 | Example 32 | Example 33 | Example 34 | Example 35 | Example 36 |
|---|---|---|---|---|---|---|---|---|
| Layer P or layer P' | Ratio of polyester composition with respect to layer P or layer P' (%) |  | 100 | 100 | 100 | 100 | 100 | 100 |
|  | kind of pigment in layer P or layer P' |  | — | — | — | — | — | — |
|  | ratio of pigment with respect to layer P or layer P' |  | 0.0 | 0.0 | 0.0 | 0.0 | 0.0 | 0.0 |
| Film (layer a) | Ratio of polyester composition with respect to the whole layer a (wt %) |  | 100 | 100 | 100 | 100 | 100 | 100 |
|  | Conditions | Stretch temperature in longitudinal direction (° C.) | 90 | 90 | 90 | 90 | 90 | 90 |
|  |  | Stretch ratio in longitudinal direction (times) | 3.5 | 3.5 | 3.5 | 3.5 | 3.5 | 3.5 |
|  |  | Stretch temperature in transverse direction (° C.) | 100 | 100 | 100 | 100 | 100 | 100 |
|  |  | Stretch ratio in transverse direction (times) | 4.2 | 4.2 | 4.2 | 4.2 | 4.2 | 4.2 |
|  |  | Heat treatment temperature (° C.) | 200 | 200 | 200 | 200 | 200 | 200 |
|  |  | Thickness (μm) | 50 | 50 | 50 | 50 | 50 | 50 |
|  | Physical properties | Planar orientation coefficient R | 5 | 5 | 5 | 5 | 5 | 5 |
|  |  | Moist heat resistance of mechanical properties | A | A | A | A | A | A |
|  |  | Half-life of elongation | 31 | 31 | 31 | 31 | 31 | 31 |
| Sheet-like structure | Structure |  | b1/c/a/c/b2 | b1/c/a/c/b2 | b1/c/a/c/b2 | b1/c/a/c/b2 | b1/c/a/c/b2 | b1/c/a/c/b2 |
|  | Layer b1 | kind | Biaxially oriented PPS | Biaxially oriented PPS | Biaxially oriented PPS | Biaxially oriented PPS | Biaxially oriented PPS | Biaxially oriented PPS |
|  |  | Thickness (μm) | 12 | 12 | 12 | 12 | 12 | 12 |
|  | Layer b2 | kind | Biaxially oriented PPS | Biaxially oriented PPS | Biaxially oriented PPS | Biaxially oriented PPS | Biaxially oriented PPS | Biaxially oriented PPS |
|  |  | Thickness (μm) | 12 | 12 | 12 | 12 | 12 | 12 |
|  |  | Laminate ratio ((B1 + B2)/A) | 0.48 | 0.48 | 0.48 | 0.48 | 0.48 | 0.48 |
|  |  | Total thickness (μm) | 84 | 84 | 84 | 84 | 84 | 84 |
|  | Performance | Processability | A | A | A | A | A | A |
|  |  | Moist heat resistance of mechanical properties | A | A | A | A | A | A |
|  |  | Half-life of elongation | 36 | 36 | 36 | 36 | 36 | 36 |
|  |  | Heat resistance | A | A | A | A | A | A |
|  |  | Half-life of elongation | 120 | 120 | 120 | 120 | 120 | 120 |
|  |  | Moist heat resistance of electrical properties | A | A | A | A | A | A |
| Solar cell back sheet | Moist heat resistance of mechanical properties |  | A | A | A | A | A | A |

TABLE 17

|  |  |  | Example 37 | Example 38 | Example 39 | Example 40 | Example 41 | Example 42 |
|---|---|---|---|---|---|---|---|---|
| Layer P or layer P' | Ratio of polyester composition with respect to layer P or layer P' (%) |  | 100 | 100 | 100 | 100 | 100 | 100 |
|  | kind of pigment in layer P or layer P' |  | — | — | — | — | — | — |
|  | ratio of pigment with respect to layer P or layer P' |  | 0.0 | 0.0 | 0.0 | 0.0 | 0.0 | 0.0 |
| Film (layer a) | Ratio of polyester composition with respect to the whole layer a (wt %) |  | 100 | 100 | 100 | 100 | 100 | 100 |
|  | Conditions | Stretch temperature in longitudinal direction (° C.) | 90 | 90 | 90 | 90 | 90 | 90 |
|  |  | Stretch ratio in longitudinal direction (times) | 3.5 | 3.5 | 3.5 | 3.5 | 3.5 | 3.5 |
|  |  | Stretch temperature in transverse direction (° C.) | 100 | 100 | 100 | 100 | 100 | 100 |
|  |  | Stretch ratio in transverse direction (times) | 4.2 | 4.2 | 4.2 | 4.2 | 4.2 | 4.2 |
|  |  | Heat treatment temperature (° C.) | 200 | 200 | 200 | 200 | 200 | 200 |
|  |  | Thickness (μm) | 50 | 50 | 50 | 50 | 50 | 50 |
|  | Physical properties | Planar orientation coefficient R | 5 | 5 | 5 | 5 | 5 | 5 |
|  |  | Moist heat resistance of mechanical properties | A | A | A | A | A | A |
|  |  | Half-life of elongation | 31 | 31 | 31 | 31 | 31 | 31 |
| Sheet-like structure | Structure |  | b1/c/a/c/b2 | b1/c/a/c/b2 | b1/c/a/c/b2 | b1/c/a/c/b2 | b1/c/a/c/b2 | b1/c/a/c/b2 |
|  | Layer b1 | kind | Biaxially oriented PPS | Biaxially oriented PPS | Biaxially oriented PPS | Biaxially oriented PPS | Biaxially oriented PPS | Biaxially oriented PPS |
|  |  | Thickness (μm) | 12 | 12 | 12 | 12 | 12 | 12 |
|  | Layer b2 | kind | Biaxially oriented PPS | Biaxially oriented PPS | Biaxially oriented PPS | Biaxially oriented PPS | Biaxially oriented PPS | Biaxially oriented PPS |
|  |  | Thickness (μm) | 12 | 12 | 12 | 12 | 12 | 12 |
|  | Laminate ratio ((B1 + B2)/A) |  | 0.48 | 0.48 | 0.48 | 0.48 | 0.48 | 0.48 |
|  | Total thickness (μm) |  | 84 | 84 | 84 | 84 | 84 | 84 |
|  | Performance | Processability | A | A | A | A | A | A |
|  |  | Moist heat resistance of mechanical properties | A | A | A | A | A | A |
|  |  | Half-life of elongation | 36 | 36 | 36 | 36 | 36 | 36 |
|  |  | Heat resistance | A | A | A | A | A | A |
|  |  | Half-life of elongation | 120 | 120 | 120 | 120 | 120 | 120 |
|  |  | Moist heat resistance of electrical properties | A | A | A | A | A | A |
| Solar cell back sheet | Moist heat resistance of mechanical properties |  | A | A | A | A | A | A |

TABLE 18

|  |  |  | Example 43 | Example 44 | Example 45 | Example 46 | Example 47 | Example 48 |
|---|---|---|---|---|---|---|---|---|
| Layer P or layer P' | Ratio of polyester composition with respect to layer P or layer P' (%) |  | 100 | 100 | 100 | 100 | 100 | 100 |
|  | kind of pigment in layer P or layer P' |  | — | — | — | — | — | — |
|  | ratio of pigment with respect to layer P or layer P' |  | 0.0 | 0.0 | 0.0 | 0.0 | 0.0 | 0.0 |
| Film (layer a) | Ratio of polyester composition with respect to the whole layer a (wt %) |  | 100 | 100 | 100 | 100 | 100 | 100 |
|  | Conditions | Stretch temperature in longitudinal direction (° C.) | 90 | 90 | 90 | 90 | 90 | 90 |
|  |  | Stretch ratio in longitudinal direction (times) | 3.5 | 3.5 | 3.5 | 3.8 | 3.5 | 3.5 |
|  |  | Stretch temperature in transverse direction (° C.) | 100 | 100 | 100 | 100 | 100 | 100 |
|  |  | Stretch ratio in transverse direction (times) | 4.2 | 4.2 | 4.2 | 4.2 | 4.2 | 4.2 |
|  |  | Heat treatment temperature (° C.) | 200 | 200 | 200 | 200 | 200 | 200 |
|  |  | Thickness (μm) | 50 | 50 | 50 | 50 | 50 | 50 |
|  | Physical properties | Planar orientation coefficient R | 5 | 5 | 5 | 8 | 5 | 5 |
|  |  | Moist heat resistance of mechanical properties | A | A | A | A | B | B |
|  |  | Half-life of elongation | 31 | 31 | 31 | 32 | 26 | 26 |
| Sheet-like structure | Structure |  | b1/c/a/c/b2 | b1/c/a/c/b2 | b1/c/a/c/b2 | b1/c/a/c/b2 | b1/c/a/c/b2 | b1/c/a/c/b2 |
|  | Layer b1 | kind | Biaxially oriented PPS | Biaxially oriented PPS | Biaxially oriented PPS | Biaxially oriented PPS | Biaxially oriented PPS | Biaxially oriented PPS |
|  |  | Thickness (μm) | 12 | 12 | 12 | 12 | 12 | 12 |
|  | Layer b2 | kind | Biaxially oriented PPS | Biaxially oriented PPS | Biaxially oriented PPS | Biaxially oriented PPS | Biaxially oriented PPS | Biaxially oriented PPS |

TABLE 18-continued

|  |  |  | Example 43 | Example 44 | Example 45 | Example 46 | Example 47 | Example 48 |
|---|---|---|---|---|---|---|---|---|
|  |  | Thickness (μm) | 12 | 12 | 12 | 12 | 12 | 12 |
|  |  | Laminate ratio ((B1 + B2)/A) | 0.48 | 0.48 | 0.48 | 0.48 | 0.48 | 0.48 |
|  |  | Total thickness (μm) | 84 | 84 | 84 | 84 | 84 | 84 |
|  | Performance | Processability | A | A | A | A | A | A |
|  |  | Moist heat resistance of mechanical properties | A | A | A | S | B | B |
|  |  | Half-life of elongation | 36 | 36 | 36 | 37 | 31 | 31 |
|  |  | Heat resistance | A | A | A | A | A | A |
|  |  | Half-life of elongation | 120 | 120 | 120 | 120 | 120 | 120 |
|  |  | Moist heat resistance of electrical properties | A | A | A | A | A | A |
| Solar cell back sheet | Moist heat resistance of mechanical properties |  | A | A | A | A | B | B |

TABLE 19

|  |  |  | Example 49 | Example 50 | Example 51 | Example 52 | Example 53 | Example 54 |
|---|---|---|---|---|---|---|---|---|
| Layer P or layer P' | Ratio of polyester composition with respect to layer P or layer P' (%) |  | 100 | 100 | 99 | 80 | 99.5 | 95 |
|  | kind of pigment in layer P or layer P' |  | — | — | Titanium dioxide | Titanium dioxide | Carbon black | Carbon black |
|  | ratio of pigment with respect to layer P or layer P' |  | 0.0 | 0.0 | 1.0 | 20.0 | 0.5 | 5.0 |
| Film (layer a) | Ratio of polyester composition with respect to the whole layer a (wt %) |  | 100 | 100 | 99 | 80 | 99.5 | 95 |
|  | Conditions | Stretch temperature in longitudinal direction (° C.) | 90 | 90 | 90 | 90 | 90 | 90 |
|  |  | Stretch ratio in longitudinal direction (times) | 3.5 | 3.5 | 3.5 | 3.5 | 3.5 | 3.5 |
|  |  | Stretch temperature in transverse direction (° C.) | 100 | 100 | 100 | 100 | 100 | 100 |
|  |  | Stretch ratio in transverse direction (times) | 4.2 | 4.2 | 4.2 | 4.2 | 4.2 | 4.2 |
|  |  | Heat treatment temperature (° C.) | 200 | 200 | 200 | 200 | 200 | 200 |
|  |  | Thickness (μm) | 50 | 50 | 50 | 50 | 50 | 50 |
|  | Physical properties | Planar orientation coefficient R | 5 | 5 | 5 | 5 | 5 | 5 |
|  |  | Moist heat resistance of mechanical properties | B | B | A | A | A | A |
|  |  | Half-life of elongation | 26 | 26 | 33 | 31 | 33 | 33 |
| Sheet-like structure | Structure |  | b1/c/a/c/b2 | b1/c/a/c/b2 | b1/c/a/c/b2 | b1/c/a/c/b2 | b1/c/a/c/b2 | b1/c/a/c/b2 |
|  | Layer b1 | kind | Biaxially oriented PPS | Biaxially oriented PPS | Biaxially oriented PPS | Biaxially oriented PPS | Biaxially oriented PPS | Biaxially oriented PPS |
|  |  | Thickness (μm) | 12 | 12 | 12 | 12 | 12 | 12 |
|  | Layer b2 | kind | Biaxially oriented PPS | Biaxially oriented PPS | Biaxially oriented PPS | Biaxially oriented PPS | Biaxially oriented PPS | Biaxially oriented PPS |
|  |  | Thickness (μm) | 12 | 12 | 12 | 12 | 12 | 12 |
|  |  | Laminate ratio ((B1 + B2)/A) | 0.48 | 0.48 | 0.48 | 0.48 | 0.48 | 0.48 |
|  |  | Total thickness (μm) | 84 | 84 | 84 | 84 | 84 | 84 |
|  | Performance | Processability | A | A | A | A | A | A |
|  |  | Moist heat resistance of mechanical properties | B | B | A | A | A | A |
|  |  | Half-life of elongation | 31 | 31 | 38 | 36 | 38 | 38 |
|  |  | Heat resistance | A | A | A | A | A | A |
|  |  | Half-life of elongation | 120 | 120 | 120 | 120 | 120 | 120 |
|  |  | Moist heat resistance of electrical properties | A | A | A | A | A | A |
| Solar cell back sheet | Moist heat resistance of mechanical properties |  | B | B | A | A | A | A |

TABLE 20

|  |  |  |  | Comparative Example 7 | Comparative Example 8 | Comparative Example 9 | Comparative Example 10 | Comparative Example 11 | Comparative Example 12 |
|---|---|---|---|---|---|---|---|---|---|
| Polyester composition | Polyester | Dicarboxylic acid ingredients | kind | Terephthalic acid | Terephthalic acid | Terephthalic acid | Terephthalic acid | Terephthalic acid | Terephthalic acid |
|  |  |  | amount (mol %) | 100 | 100 | 100 | 100 | 100 | 100 |
|  |  | Diol ingredients | kind | Ethylene glycol | Ethylene glycol | Ethylene glycol | Ethylene glycol | Ethylene glycol | Ethylene glycol |
|  |  |  | amount (mol %) | 100 | 100 | 100 | 100 | 100 | 100 |

TABLE 20-continued

| | | Comparative Example 7 | Comparative Example 8 | Comparative Example 9 | Comparative Example 10 | Comparative Example 11 | Comparative Example 12 |
|---|---|---|---|---|---|---|---|
| Ingredients having at least 3 carboxylic acid groups, and Ingredients having at least 3 hydroxy groups | kind | — | — | — | — | — | — |
| | amount relative to the whole ingredients (mol %) | — | — | — | — | — | — |
| Alkali metal phosphate | kind | Sodium dihydrogen phosphate | Sodium dihydrogen phosphate | Sodium dihydrogen phosphate | Sodium dihydrogen phosphate | Sodium dihydrogen phosphate | Sodium dihydrogen phosphate |
| | kind of alkali metal element | Na | Na | Na | Na | Na | Na |
| | amount of alkali metal element (mol/t) | 3.00 | 1.30 | 1.30 | 4.00 | 4.00 | 1.18 |
| Phosphorus acid | amount of phosphorus acid (mol/t) | 2.00 | 0.40 | 0.40 | 2.10 | 2.10 | 0.52 |
| Phosphorus acid/Alkali metal phosphate | | 0.67 | 0.31 | 0.31 | 0.53 | 0.53 | 0.44 |
| Amount of phosphorus (mol/t) | | 5.00 | 1.70 | 1.70 | 6.10 | 6.10 | 1.70 |
| divalent metal element | kind | Mn | Mn | Mn | Mn | Mn | Mn |
| | amount of metal element (mol/t) | 14.00 | 1.22 | 4.62 | 4.71 | 16.91 | 4.51 |
| Mn/Ca | amount of Mn (mol/t) | 14.00 | 1.22 | 4.62 | 4.71 | 16.91 | 4.51 |
| | amount of Ca (mol/t) | 0.00 | 0.00 | 0.00 | 0.00 | 0.00 | 0.00 |
| Other than Mn/Ca | kind | — | — | — | — | — | — |
| | amount (mol/t) | — | — | — | — | — | — |
| M | | 15.50 | 1.87 | 5.27 | 6.71 | 18.91 | 5.10 |
| M/P | | 3.10 | 1.10 | 3.10 | 1.10 | 3.10 | 3.00 |
| Characteristics | Tg (° C.) | 82 | 82 | 82 | 82 | 82 | 82 |
| | Tm (° C.) | 255 | 255 | 255 | 255 | 255 | 255 |
| | IV | 0.85 | 0.85 | 0.85 | 0.85 | 0.85 | 0.85 |
| | COOH (eq./t) | 14.0 | 14.0 | 14.0 | 14.0 | 14.0 | 14.0 |

TABLE 21

| | | | | Comparative Example 13 | Comparative Example 14 | Comparative Example 15 | Comparative Example 16 | Comparative Example 17 | Comparative Example 18 |
|---|---|---|---|---|---|---|---|---|---|
| Polyester composition | Polyester | Dicarboxylic acid ingredients | kind | Terephthalic acid | Terephthalic acid | Terephthalic acid | Terephthalic acid | Terephthalic acid | Terephthalic acid |
| | | | amount (mol %) | 100 | 100 | 100 | 100 | 100 | 100 |
| | | Diol ingredients | kind | Ethylene glycol | Ethylene glycol | Ethylene glycol | Ethylene glycol | Ethylene glycol | Ethylene glycol |
| | | | amount (mol %) | 100 | 100 | 100 | 100 | 100 | 100 |
| | | Ingredients having at least 3 carboxylic acid groups, and Ingredients having at least 3 hydroxy groups | kind | — | — | — | — | — | — |
| | | | amount relative to the whole ingredients (mol %) | — | — | — | — | — | — |
| | Alkali metal phosphate | | kind | Sodium dihydrogen phosphate | Sodium dihydrogen phosphate | Sodium dihydrogen phosphate | Sodium dihydrogen phosphate | Sodium dihydrogen phosphate | Sodium dihydrogen phosphate |
| | | | kind of alkali metal element | Na | Na | Na | Na | Na | Na |
| | | | amount of alkali metal element (mol/t) | 3.00 | 3.00 | 1.30 | 1.30 | 3.00 | 3.50 |

TABLE 21-continued

|  |  | Comparative Example 13 | Comparative Example 14 | Comparative Example 15 | Comparative Example 16 | Comparative Example 17 | Comparative Example 18 |
|---|---|---|---|---|---|---|---|
|  | Phosphorus acid amount of phosphorus acid (mol/t) | 2.10 | 2.10 | 0.52 | 0.52 | 2.00 | 1.50 |
|  | Phosphorus acid/Alkali metal phosphate | 0.70 | 0.70 | 0.40 | 0.40 | 0.67 | 0.43 |
|  | Amount of phosphorus (mol/t) | 5.10 | 5.10 | 1.82 | 1.82 | 5.00 | 5.00 |
| divalent metal element | kind | Mn | Mn | Mg | Mg | Mg | Mg |
|  | amount of metal element (mol/t) | 13.80 | 3.60 | 1.35 | 4.81 | 4.00 | 13.25 |
| Mn/Ca | amount of Mn (mol/t) | 13.80 | 3.60 | 0.00 | 0.00 | 0.00 | 0.00 |
|  | amount of Ca (mol/t) | 0.00 | 0.00 | 0.00 | 0.00 | 0.00 | 0.00 |
| Other than Mn/Ca | kind | — | — | Mg | Mg | Mg | Mg |
|  | amount (mol/t) | — | — | 1.35 | 4.81 | 4.00 | 13.25 |
|  | M | 15.50 | 5.10 | 0.65 | 0.65 | 1.50 | 1.75 |
|  | M/P | 3.00 | 1.00 | 0.36 | 0.36 | 0.30 | 0.35 |
| Characteristics | Tg (° C.) | 82 | 82 | 82 | 82 | 82 | 82 |
|  | Tm (° C.) | 255 | 255 | 255 | 255 | 255 | 255 |
|  | IV | 0.85 | 0.85 | 0.85 | 0.85 | 0.85 | 0.85 |
|  | COOH (eq./t) | 14.0 | 14.0 | 14.0 | 14.0 | 14.0 | 14.0 |

TABLE 22

|  |  |  | Comparative Example 1 | Comparative Example 2 | Comparative Example 3 | Comparative Example 4 | Comparative Example 5 | Comparative Example 6 |
|---|---|---|---|---|---|---|---|---|
| Layer P or layer P' | Ratio of polyester composition with respect to layer P or layer P' (%) |  | 100 | 100 | 100 | 100 | 100 | 100 |
|  | kind of pigment in layer P or layer P' |  | — | — | — | — | — | — |
|  | ratio of pigment with respect to layer P or layer P' |  | 0.0 | 0.0 | 0.0 | 0.0 | 0.0 | 0.0 |
| Film (layer a) | Ratio of polyester composition with respect to the whole layer a (wt %) |  | 100 | 100 | 100 | 100 | 100 | 100 |
|  | Conditions | Stretch temperature in longitudinal direction (° C.) | 90 | 90 | 90 | 90 | 90 | 90 |
|  |  | Stretch ratio in longitudinal direction (times) | 3.5 | 3.5 | 3.5 | 3.5 | 3.5 | 3.5 |
|  |  | Stretch temperature in transverse direction (° C.) | 100 | 100 | 100 | 100 | 100 | 100 |
|  |  | Stretch ratio in transverse direction (times) | 4.2 | 4.2 | 4.2 | 4.2 | 4.2 | 4.2 |
|  |  | Heat treatment temperature (° C.) | 200 | 200 | 200 | 200 | 200 | 200 |
|  |  | Thickness (μm) | 50 | 50 | 50 | 50 | 50 | 50 |
|  | Physical properties | Planar orientation coefficient R | 5 | 5 | 5 | 5 | 5 | 5 |
|  |  | Moist heat resistance of mechanical properties | C | C | C | C | C | C |
|  |  | Half-life of elongation | 20 | 20 | 20 | 20 | 20 | 20 |
| Sheet-like structure | Structure |  | b1/c/a/c/b2 | b1/c/a/c/b2 | b1/c/a/c/b2 | b1/c/a/c/b2 | b1/c/a/c/b2 | b1/c/a/c/b2 |
|  | Layer b1 | kind | Biaxially oriented PPS | Biaxially oriented PPS | Biaxially oriented PPS | Biaxially oriented PPS | Biaxially oriented PPS | Biaxially oriented PPS |
|  |  | Thickness (μm) | 12 | 12 | 12 | 12 | 12 | 12 |
|  | Layer b2 | kind | Biaxially oriented PPS | Biaxially oriented PPS | Biaxially oriented PPS | Biaxially oriented PPS | Biaxially oriented PPS | Biaxially oriented PPS |
|  |  | Thickness (μm) | 12 | 12 | 12 | 12 | 12 | 12 |
|  | Laminate ratio ((B1 + B2)/A) |  | 0.48 | 0.48 | 0.48 | 0.48 | 0.48 | 0.48 |
|  | Total thickness (μm) |  | 84 | 84 | 84 | 84 | 84 | 84 |
|  | Performance | Processability | A | A | A | A | A | A |
|  |  | Moist heat resistance of mechanical properties | D | D | D | D | D | D |
|  |  | Half-life of elongation | 22 | 22 | 22 | 22 | 22 | 22 |
|  |  | Heat resistance | A | A | A | A | A | A |
|  |  | Half-life of elongation | 110 | 110 | 110 | 110 | 110 | 110 |
|  |  | Moist heat resistance of electrical properties | B | B | B | B | B | B |
| Solar cell back sheet | Moist heat resistance of mechanical properties |  | C | C | C | C | C | C |

TABLE 23

| | | Comparative Example 7 | Comparative Example 8 | Comparative Example 9 | Comparative Example 10 | Comparative Example 11 | Comparative Example 12 |
|---|---|---|---|---|---|---|---|
| Layer P or layer P' | Ratio of polyester composition with respect to layer P or layer P' (%) | 100 | 100 | 100 | 100 | 100 | 100 |
| | kind of pigment in layer P or layer P' | — | — | — | — | — | — |
| | ratio of pigment with respect to layer P or layer P' | 0.0 | 0.0 | 0.0 | 0.0 | 0.0 | 0.0 |
| Film (layer a) | Ratio of polyester composition with respect to the whole layer a (wt %) | 100 | 100 | 100 | 100 | 100 | 100 |
| | Conditions Stretch temperature in longitudinal direction (° C.) | 90 | 90 | 90 | 90 | 90 | 90 |
| | Stretch ratio in longitudinal direction (times) | 3.5 | 3.5 | 3.5 | 3.5 | 3.5 | 3.5 |
| | Stretch temperature in transverse direction (° C.) | 100 | 100 | 100 | 100 | 100 | 100 |
| | Stretch ratio in transverse direction (times) | 4.2 | 4.2 | 4.2 | 4.2 | 4.2 | 4.2 |
| | Heat treatment temperature (° C.) | 200 | 200 | 200 | 200 | 200 | 200 |
| | Thickness (μm) | 50 | 50 | 50 | 50 | 50 | 50 |
| | Physical properties Planar orientation coefficient R | 5 | 5 | 5 | 5 | 5 | 5 |
| | Moist heat resistance of mechanical properties | C | C | C | C | C | C |
| | Half-life of elongation | 20 | 20 | 20 | 20 | 20 | 20 |
| Sheet-like structure | Structure | b1/c/a/c/b2 | b1/c/a/c/b2 | b1/c/a/c/b2 | b1/c/a/c/b2 | b1/c/a/c/b2 | b1/c/a/c/b2 |
| | Layer b1 kind | Biaxially oriented PPS | Biaxially oriented PPS | Biaxially oriented PPS | Biaxially oriented PPS | Biaxially oriented PPS | Biaxially oriented PPS |
| | Thickness (μm) | 12 | 12 | 12 | 12 | 12 | 12 |
| | Layer b2 kind | Biaxially oriented PPS | Biaxially oriented PPS | Biaxially oriented PPS | Biaxially oriented PPS | Biaxially oriented PPS | Biaxially oriented PPS |
| | Thickness (μm) | 12 | 12 | 12 | 12 | 12 | 12 |
| | Laminate ratio ((B1 + B2)/A) | 0.48 | 0.48 | 0.48 | 0.48 | 0.48 | 0.48 |
| | Total thickness (μm) | 84 | 84 | 84 | 84 | 84 | 84 |
| | Performance Processability | A | A | A | A | A | A |
| | Moist heat resistance of mechanical properties | D | D | D | D | D | D |
| | Half-life of elongation | 22 | 22 | 22 | 22 | 22 | 22 |
| | Heat resistance | A | A | A | A | A | A |
| | Half-life of elongation | 110 | 110 | 110 | 110 | 110 | 110 |
| | Moist heat resistance of electrical properties | B | B | B | B | B | B |
| Solar cell back sheet | Moist heat resistance of mechanical properties | C | C | C | C | C | C |

TABLE 24

| | | Comparative Example 13 | Comparative Example 14 | Comparative Example 15 | Comparative Example 16 | Comparative Example 17 | Comparative Example 18 |
|---|---|---|---|---|---|---|---|
| Layer P or layer P' | Ratio of polyester composition with respect to layer P or layer P' (%) | 100 | 100 | 100 | 100 | 100 | 100 |
| | kind of pigment in layer P or layer P' | — | — | — | — | — | — |
| | ratio of pigment with respect to layer P or layer P' | 0.0 | 0.0 | 0.0 | 0.0 | 0.0 | 0.0 |
| Film (layer a) | Ratio of polyester composition with respect to the whole layer a (wt %) | 100 | 100 | 100 | 100 | 100 | 100 |
| | Conditions Stretch temperature in longitudinal direction (° C.) | 90 | 90 | 90 | 90 | 90 | 90 |
| | Stretch ratio in longitudinal direction (times) | 3.5 | 3.5 | 3.5 | 3.5 | 3.5 | 3.5 |
| | Stretch temperature in transverse direction (° C.) | 100 | 100 | 100 | 100 | 100 | 100 |
| | Stretch ratio in transverse direction (times) | 4.2 | 4.2 | 4.2 | 4.2 | 4.2 | 4.2 |
| | Heat treatment temperature (° C.) | 200 | 200 | 200 | 200 | 200 | 200 |
| | Thickness (μm) | 50 | 50 | 50 | 50 | 50 | 50 |
| | Physical properties Planar orientation coefficient R | 5 | 5 | 5 | 5 | 5 | 5 |
| | Moist heat resistance of mechanical properties | C | C | C | C | C | C |
| | Half-life of elongation | 20 | 20 | 20 | 20 | 20 | 20 |
| Sheet-like structure | Structure | b1/c/a/c/b2 | b1/c/a/c/b2 | b1/c/a/c/b2 | b1/c/a/c/b2 | b1/c/a/c/b2 | b1/c/a/c/b2 |
| | Layer b1 kind | Biaxially oriented PPS | Biaxially oriented PPS | Biaxially oriented PPS | Biaxially oriented PPS | Biaxially oriented PPS | Biaxially oriented PPS |

TABLE 24-continued

|  |  | Comparative Example 13 | Comparative Example 14 | Comparative Example 15 | Comparative Example 16 | Comparative Example 17 | Comparative Example 18 |
|---|---|---|---|---|---|---|---|
| Layer b2 | Thickness (μm) | 12 | 12 | 12 | 12 | 12 | 12 |
|  | kind | Biaxially oriented PPS | Biaxially oriented PPS | Biaxially oriented PPS | Biaxially oriented PPS | Biaxially oriented PPS | Biaxially oriented PPS |
|  | Thickness (μm) | 12 | 12 | 12 | 12 | 12 | 12 |
| Laminate ratio ((B1 + B2)/A) |  | 0.48 | 0.48 | 0.48 | 0.48 | 0.48 | 0.48 |
| Total thickness (μm) |  | 84 | 84 | 84 | 84 | 84 | 84 |
| Performance | Processability | A | A | A | A | A | A |
|  | Moist heat resistance of mechanical properties | D | D | D | D | D | D |
|  | Half-life of elongation | 22 | 22 | 22 | 22 | 22 | 22 |
|  | Heat resistance | A | A | A | A | A | A |
|  | Half-life of elongation | 110 | 110 | 110 | 110 | 110 | 110 |
|  | Moist heat resistance of electrical properties | B | B | B | B | B | B |
| Solar cell back sheet | Moist heat resistance of mechanical properties | C | C | C | C | C | C |

INDUSTRIAL APPLICABILITY

The polyester compositions and films have high moist heat resistance, and due to such characteristics, are suitable for various uses in which moist heat resistance is of major importance, such as solar battery back sheet, electrical insulation material for water-heating motors, electrical insulation material for automobile air-conditioning motors or driving motors used in hybrid cars, material for capacitors, material for automobiles, and material for construction. In such uses, the polyester compositions and films are suitable for films for solar battery back sheets and electrical insulation materials for motors, and particularly suitable for electrical insulation materials for motors. Furthermore, the sheet-like structure can exhibit excellent moist heat resistance over the long term, and due to such characteristics, is highly suitable for electrical insulation materials.

The invention claimed is:

1. A polyester composition comprising polyester as a main component, wherein:
    said polyester composition contains a phosphoric acid and an alkali metal phosphate,
    a phosphorus element content P (mol/t) is 1.8 mol/t or more and 5.0 mol/t or less relative to the whole of said polyester composition,
    said polyester composition contains at least one kind of metal element of Mn or Ca,
    any divalent metal element content other than Mn and Ca is 5 ppm or less relative to the whole of said polyester composition, and
    when an alkali metal element content relative to the whole of said polyester composition is denoted by M1 (mol/t), and a total amount of Mn element content and Ca element content relative to the whole of said polyester composition is denoted by M2 (mol/t), a metal element content M (mol/t) in said polyester composition which is calculated by expression (i) below and said phosphorus element content P (mol/t) satisfy expression (ii):

$$M=M1/2+M2 \quad (i)$$

$$1.1 \leq M/P \leq 3.0. \quad (ii)$$

2. The polyester composition according to claim 1, wherein said polyester which is the main component of said polyester composition contains a constituent ingredient having at least three carboxylic acid groups and/or hydroxyl groups as a copolymerization ingredient, and an amount of said constituent ingredient is 0.025 mol % or more and 1.5 mol % or less relative to the whole of constituent ingredients in said polyester.

3. A polyester film having a layer (layer P) containing a polyester composition comprising polyester as a main component, wherein:
    said polyester is biaxially oriented,
    said polyester composition contains a phosphoric acid and an alkali metal phosphate,
    a phosphorus element content P (mol/t) in said polyester composition is 1.8 mol/t or more and 5.0 mol/t or less relative to the whole of said polyester composition,
    said polyester composition contains at least one kind of metal element of Mn or Ca,
    any divalent metal element content other than Mn and Ca is 5 ppm or less relative to the whole of said polyester composition, and
    when an alkali metal element content relative to the whole of said polyester composition is denoted by M1 (mol/t), and a total amount of Mn element content and Ca element content relative to the whole of said polyester composition is denoted by M2 (mol/t), a metal element content M (mol/t) in said polyester composition which is calculated by expression (i) below and said phosphorus element content P (mol/t) satisfy expression (ii):

$$M=M1/2+M2 \quad (i)$$

$$1.1 \leq M/P \leq 3.0. \quad (ii)$$

4. The film according to claim 3, wherein said layer P is layer P' containing a coloring pigment, and, a content amount of white pigment as said coloring pigment is 1 wt % or more and 20 wt % or less relative to the whole of said layer P', or a content amount of black pigment as said coloring pigment is 0.5 wt % or more and 5 wt % or less relative to the whole of said layer P'.

5. A solar cell back sheet comprising a polyester composition comprising polyester as a main component, wherein:
    said polyester composition contains a phosphoric acid and an alkali metal phosphate,
    a phosphorus element content P (mol/t) in said polyester composition is 1.8 mol/t or more and 5.0 mol/t or less relative to the whole of said polyester composition,
    said polyester composition contains at least one kind of metal element of Mn or Ca, any divalent metal element content other than Mn and Ca is 5 ppm or less relative to the whole of said polyester composition, and when an alkali metal element content relative to the whole of said polyester composition is represented by M1 (mol/t) and a total amount of Mn element content and Ca element content relative to the whole of said polyester composition is represented by M2 (mol/t), a metal element content M (mol/t) in said polyester composition which is calculated by expression (i) below and said phosphorus element content P (mol/t) satisfy expression (ii):

$$M = M1/2 + M2 \quad \text{(i)}$$

$$1.1 \leq M/P \leq 3.0. \quad \text{(ii)}$$

* * * * *